(12) United States Patent
Bae et al.

(10) Patent No.: US 8,834,968 B2
(45) Date of Patent: *Sep. 16, 2014

(54) METHOD OF FORMING PHASE CHANGE MATERIAL LAYER USING GE(II) SOURCE, AND METHOD OF FABRICATING PHASE CHANGE MEMORY DEVICE

(71) Applicant: Samsung Electronics Co., Ltd., Suwon-si (KR)

(72) Inventors: Byoung-Jae Bae, Hwaseong-si (KR); Sung-Lae Cho, Yongin-si (KR); Jin-Il Lee, Seongnam-si (KR); Hye-Young Park, Seongnam-si (KR); Do-Hyung Kim, Seongnam-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/708,914

(22) Filed: Dec. 7, 2012

(65) Prior Publication Data

US 2013/0101491 A1     Apr. 25, 2013

Related U.S. Application Data

(63) Continuation-in-part of application No. 13/429,546, filed on Mar. 26, 2012, and a continuation of application No. 12/248,964, filed on Oct. 10, 2008, now Pat. No. 8,142,846.

(51) Int. Cl.
*C23C 16/30* (2006.01)
*H01L 21/71* (2006.01)
(Continued)

(52) U.S. Cl.
CPC ............ *C01B 19/04* (2013.01); *H01L 45/1233* (2013.01); *G11C 13/0004* (2013.01); *H01L 45/06* (2013.01); *H01L 45/1683* (2013.01); *H01L 45/1691* (2013.01); *C23C 16/305* (2013.01); *H01L 45/144* (2013.01); *H01L 45/124* (2013.01); *C23C 16/45531* (2013.01); *H01L 45/1616* (2013.01); *C23C 16/45553* (2013.01); *H01L 27/2436* (2013.01); *H01L 45/148* (2013.01)
USPC ..................... 427/255.29; 438/382

(58) Field of Classification Search
USPC ..................... 427/255.29; 438/382
See application file for complete search history.

(56) References Cited

U.S. PATENT DOCUMENTS

| 4,927,670 A | 5/1990 | Erbil |
| 4,948,623 A | 8/1990 | Beach et al. |

(Continued)

FOREIGN PATENT DOCUMENTS

| DE | 102008026889 A1 | 8/2009 |
| EP | 1675194 A2 | 6/2006 |

(Continued)

OTHER PUBLICATIONS

Abrutis, A. et al., Hot Wire Chemical Vapor Deposition of Chalcogenide Materials for Phase Change Memory Applications, Chem. Mater., May 2008, p. 3557 3559, vol. 20, No. 11.

(Continued)

*Primary Examiner* — Evan Pert
(74) *Attorney, Agent, or Firm* — Muir Patent Consulting, PLLC

(57) ABSTRACT

In one aspect, a method of forming a phase change material layer is provided. The method includes supplying a reaction gas including the composition of Formula 1 into a reaction chamber, supplying a first source which includes Ge(II) into the reaction chamber, and supplying a second source into the reaction chamber. Formula 1 is $NR_1R_2R_3$, where $R_1$, $R_2$ and $R_3$ are each independently at least one selected from the group consisting of H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ and $N(C_2H_5)_2$.

15 Claims, 8 Drawing Sheets

(51) Int. Cl.
*H01L 45/00* (2006.01)
*C01B 19/04* (2006.01)
*G11C 13/00* (2006.01)
*C23C 16/455* (2006.01)
*H01L 27/24* (2006.01)

(56) References Cited

U.S. PATENT DOCUMENTS

| | | |
|---|---|---|
| 4,960,916 A | 10/1990 | Pazik |
| 4,962,214 A | 10/1990 | Villacorta et al. |
| 5,296,716 A | 3/1994 | Ovshinsky et al. |
| 5,453,494 A | 9/1995 | Kirlin et al. |
| 5,596,522 A | 1/1997 | Ovshinsky et al. |
| 6,005,127 A | 12/1999 | Todd et al. |
| 6,086,779 A | 7/2000 | Bishop et al. |
| 6,123,993 A | 9/2000 | Xu et al. |
| 6,146,608 A | 11/2000 | Todd et al. |
| 6,269,979 B1 | 8/2001 | Dumont |
| 6,331,211 B1 | 12/2001 | Xu et al. |
| 6,511,718 B1 | 1/2003 | Paz de Araujo et al. |
| 6,646,122 B1 | 11/2003 | Nuhlen et al. |
| 6,750,079 B2 | 6/2004 | Lowrey et al. |
| 6,787,186 B1 | 9/2004 | Hintermaier |
| 6,861,559 B2 | 3/2005 | Odom |
| 6,869,638 B2 | 3/2005 | Baum et al. |
| 6,872,963 B2 | 3/2005 | Kostylev et al. |
| 6,984,591 B1 | 1/2006 | Buchanan et al. |
| 6,998,289 B2 | 2/2006 | Hudgens et al. |
| 7,029,978 B2 | 4/2006 | Dodge |
| 7,087,482 B2 | 8/2006 | Yeo et al. |
| 7,115,927 B2 | 10/2006 | Hideki et al. |
| 7,141,488 B2 | 11/2006 | Woelk et al. |
| 7,173,271 B2 | 2/2007 | Chang |
| 7,312,165 B2 | 12/2007 | Jursich et al. |
| 7,371,429 B2 | 5/2008 | Lee et al. |
| 7,399,666 B2 | 7/2008 | Ahn et al. |
| 7,402,851 B2 | 7/2008 | Hideki et al. |
| 7,419,698 B2 | 9/2008 | Jones |
| 7,425,735 B2 | 9/2008 | Park et al. |
| 7,462,900 B2 | 12/2008 | Hideki et al. |
| 7,476,917 B2 | 1/2009 | Hideki et al. |
| 7,518,007 B2 | 4/2009 | Seo et al. |
| 7,569,417 B2 | 8/2009 | Lee et al. |
| 7,615,401 B2 | 11/2009 | Park et al. |
| 7,638,787 B2 | 12/2009 | An et al. |
| 7,666,789 B2 | 2/2010 | Choi et al. |
| 7,667,218 B2 | 2/2010 | Yamamoto et al. |
| 7,704,787 B2 | 4/2010 | Hideki et al. |
| 7,727,884 B2 | 6/2010 | Bae et al. |
| 7,728,172 B2 | 6/2010 | Lee et al. |
| 7,737,290 B2 | 6/2010 | Gordon et al. |
| 7,803,657 B2 | 9/2010 | Choi et al. |
| 7,838,329 B2 | 11/2010 | Hunks et al. |
| 7,858,152 B2 | 12/2010 | Ovshinsky et al. |
| 7,902,048 B2 | 3/2011 | Shin et al. |
| 7,935,564 B2 | 5/2011 | Breitwisch et al. |
| 7,960,205 B2 | 6/2011 | Xiao et al. |
| 8,008,117 B2 | 8/2011 | Hunks et al. |
| 8,093,140 B2 | 1/2012 | Chen et al. |
| 8,142,846 B2 * | 3/2012 | Bae et al. .............. 427/255.29 |
| 8,268,655 B2 * | 9/2012 | Chen et al. ........................ 438/30 |
| 8,268,665 B2 | 9/2012 | Hunks et al. |
| 8,288,198 B2 * | 10/2012 | Roeder et al. .................. 438/99 |
| 2002/0004266 A1 | 1/2002 | Hashimoto et al. |
| 2002/0090815 A1 | 7/2002 | Koike et al. |
| 2003/0135061 A1 | 7/2003 | Norman et al. |
| 2004/0012009 A1 | 1/2004 | Casagrande et al. |
| 2004/0038808 A1 | 2/2004 | Hampden-Smith et al. |
| 2004/0197945 A1 | 10/2004 | Woelk et al. |
| 2004/0215030 A1 | 10/2004 | Norman et al. |
| 2005/0002227 A1 | 1/2005 | Hideki et al. |
| 2005/0029502 A1 | 2/2005 | Hudgens et al. |
| 2005/0082624 A1 | 4/2005 | Gousev et al. |
| 2005/0208699 A1 | 9/2005 | Furkay et al. |
| 2005/0227496 A1 | 10/2005 | Park et al. |
| 2005/0283012 A1 | 12/2005 | Xu et al. |
| 2005/0287747 A1 | 12/2005 | Chakravarti et al. |
| 2006/0006449 A1 | 1/2006 | Jeong et al. |
| 2006/0027451 A1 | 2/2006 | Park et al. |
| 2006/0035462 A1 | 2/2006 | Millward |
| 2006/0049447 A1 | 3/2006 | Lee et al. |
| 2006/0115595 A1 | 6/2006 | Shenai-Khatkhate et al. |
| 2006/0138393 A1 | 6/2006 | Seo et al. |
| 2006/0141155 A1 | 6/2006 | Gordon et al. |
| 2006/0172067 A1 | 8/2006 | Ovshinsky et al. |
| 2006/0172083 A1 | 8/2006 | Lee et al. |
| 2006/0180811 A1 | 8/2006 | Lee et al. |
| 2007/0121363 A1 | 5/2007 | Lung |
| 2007/0154637 A1 | 7/2007 | Shenai-Khatkhate et al. |
| 2007/0160760 A1 | 7/2007 | Shin et al. |
| 2008/0003359 A1 | 1/2008 | Gordon et al. |
| 2008/0035906 A1 | 2/2008 | Park et al. |
| 2008/0035961 A1 | 2/2008 | Chen et al. |
| 2008/0054244 A1 | 3/2008 | Lee et al. |
| 2008/0078984 A1 | 4/2008 | Park et al. |
| 2008/0118636 A1 | 5/2008 | Shin et al. |
| 2008/0145702 A1 | 6/2008 | Shin et al. |
| 2008/0210163 A1 | 9/2008 | Carlson et al. |
| 2008/0210924 A1 | 9/2008 | Shin |
| 2008/0254218 A1 | 10/2008 | Lei et al. |
| 2008/0254232 A1 | 10/2008 | Gordon et al. |
| 2008/0272355 A1 | 11/2008 | Cho et al. |
| 2008/0286446 A1 | 11/2008 | Kamepalli et al. |
| 2008/0290335 A1 | 11/2008 | Lin et al. |
| 2009/0022883 A1 | 1/2009 | Ovshinsky et al. |
| 2009/0032952 A1 | 2/2009 | Chen et al. |
| 2009/0050869 A1 | 2/2009 | Kim et al. |
| 2009/0074652 A1 | 3/2009 | Dussarrat |
| 2009/0097305 A1 | 4/2009 | Bae et al. |
| 2009/0112009 A1 | 4/2009 | Chen et al. |
| 2009/0124039 A1 | 5/2009 | Roeder et al. |
| 2009/0142881 A1 | 6/2009 | Xiao et al. |
| 2009/0162973 A1 | 6/2009 | Gatineau et al. |
| 2009/0191330 A1 | 7/2009 | Xiao |
| 2009/0215225 A1 | 8/2009 | Stender et al. |
| 2009/0227066 A1 | 9/2009 | Joseph et al. |
| 2009/0275164 A1 | 11/2009 | Chen et al. |
| 2009/0280052 A1 | 11/2009 | Xiao et al. |
| 2009/0291208 A1 | 11/2009 | Gordon et al. |
| 2009/0299084 A1 | 12/2009 | Okubo et al. |
| 2009/0305458 A1 | 12/2009 | Hunks et al. |
| 2009/0321733 A1 | 12/2009 | Gatineau et al. |
| 2010/0055831 A1 | 3/2010 | An et al. |
| 2010/0159637 A1 | 6/2010 | Lee et al. |
| 2010/0190341 A1 | 7/2010 | Park et al. |
| 2010/0317150 A1 | 12/2010 | Hunks et al. |
| 2010/0320434 A1 | 12/2010 | Choi et al. |
| 2011/0124182 A1 | 5/2011 | Zheng |
| 2011/0263100 A1 | 10/2011 | Hunks et al. |
| 2013/0005112 A1 * | 1/2013 | Bae et al. ..................... 438/382 |

FOREIGN PATENT DOCUMENTS

| | | |
|---|---|---|
| EP | 1995236 A1 | 11/2008 |
| EP | 2067876 A2 | 11/2008 |
| EP | 2130942 A2 | 8/2009 |
| JP | 58-038296 | 3/1983 |
| JP | 2001-067720 | 3/2001 |
| JP | 2008 131046 A | 5/2008 |
| JP | 2009 149980 A | 11/2008 |
| KR | 10 2005 0048891 A | 5/2005 |
| KR | 10 2005 0084997 A | 8/2005 |
| KR | 10-2006-0074236 A | 7/2006 |
| KR | 10 2006 0091160 A | 8/2006 |
| KR | 10-2007-0023433 A | 2/2007 |
| KR | 10-0695168 B1 | 3/2007 |
| KR | 10 2007 0025612 A | 8/2007 |
| KR | 10 2008 0052362 A | 6/2008 |
| KR | 10 2009 0008799 A | 1/2009 |
| KR | 10 2009 0054925 A | 1/2009 |
| SU | 768457 A | 7/1980 |
| WO | WO 2004/046417 A2 | 3/2004 |
| WO | WO 2006/012052 A2 | 2/2006 |
| WO | WO 2007/067604 A2 | 6/2007 |

(56) References Cited

FOREIGN PATENT DOCUMENTS

| WO | WO 2007/140813 A1 | 12/2007 |
|---|---|---|
| WO | WO 2008/002546 A1 | 3/2008 |
| WO | WO 2008/057616 A2 | 5/2008 |
| WO | WO 2009/039187 A1 | 3/2009 |
| WO | WO 2009/134989 A2 | 5/2009 |
| WO | WO 2010/055423 A2 | 5/2010 |
| WO | WO 2010/135702 A2 | 11/2010 |

OTHER PUBLICATIONS

Aeilts, S., et al., Aluminum Alkyl Complexes Containing Guanidinate Ligands, Organometallics, Jun. 24, 1998, p. 3265 3270, vol. 17.

Aharonovich, S., et al., N,N' Bis Silylated Lithium Aryl Amidinates: Synthesis, Characterization, and the Gradual Transition of Coordination . . . , Organometallics, Mar. 15, 2008, p. 1869 1877, vol. 27.

Anderson, H., Dialkylaminogermanes and Dialkylaminosilanes, J. Amer. Chem. Soc., Mar. 20, 1952, p. 1421 1423, vol. 74, No. 6.

Anderson, Q., et al., Synthesis and Characterization of the First Pentaphenylcyclopentadienyl Copper (I) Complex, (Ph5Cp) Cu (PPh3), Organometallics, 1998, p. 4917 4920, vol. 17.

Archibald, S., et al., Synthesis and Characterization of Silver (I) Complexes With C Alkyl Functionalized N,N' Diphenylamidinates: . . . , Journal of Cluster Science, Mar. 2000, p. 261 283 (Abstract only), vol. 11, No. 1.

Artaud Gillet, M., et al., Evaluation of copper organometallic sources for CuGaSe2 photovoltaic applications, Journal of Crystal Growth, 2003, p. 163 168, vol. 248.

Auner, N., et al., Organosilicon Chemistry IV: From Molecules to Materials, Mar. 2000, p. 291 No. (Abstract), Publisher: Wiley Vch.

Office Action dated Apr. 10, 2014, from the Korean Patent Office in related patent application KR10-2007-0102585.

* cited by examiner

METHOD OF FORMING PHASE CHANGE MATERIAL LAYER USING GE(II) SOURCE, AND METHOD OF FABRICATING PHASE CHANGE MEMORY DEVICE

PRIORITY CLAIM

This application is a continuation-in-part of and claims priority to U.S. patent application Ser. No. 13/429,546, filed Mar. 26, 2012, which is a continuation of U.S. patent application Ser. No. 12/248,964, filed Oct. 10, 2008, now U.S. Pat. No. 8,142,846, which claims priority to Korean Patent Application No. 10-2007-0102585, filed Oct. 11, 2007, in the Korean Intellectual Property Office, the disclosure of each of which is incorporated herein in its entirety by reference.

SUMMARY

The present disclosure generally relates to methods of forming a phase change material layer using a Ge(II) source, and to methods of fabricating a phase change memory device.

Chalcogenide is responsive to temperature conditions so as to be stably transformed between crystalline and amorphous states. The crystalline state has a lower specific resistance than the amorphous state, and this phase change property can be utilized to store data. A phase change random access memory (PRAM) is one example of a memory device which utilizes the phase change characteristics of chalcogenide to store data.

Each unit memory cell of a PRAM generally includes an access device and a phase change resistor which may, for example, be electrically connected between a bit line and a word line of the PRAM. The phase change resistor is a variable resistor and generally includes a phase change material film disposed between a lower electrode and an upper electrode. Typically, the access device is electrically connected to the lower electrode.

FIG. 1 illustrates temperature conditions applied to the phase change resistor during "set" and "reset" programming operations. Set programming refers to the process of placing the phase change resistor in its crystalline state, whereas reset programming refers to placing the phase change resistor in its amorphous state. It should be noted that the terms "crystalline state" and "amorphous state" are relative terms. That is, the phase change resistor need not be fully crystalline in the crystalline state, and the phase change resistor need not be fully amorphous in the amorphous state.

As shown in FIG. 1, set programming entails heating of the phase change material of the phase change resistor at a temperature which falls between a crystallization temperature Tx and a melting point temperature Tm, followed by cooling. Reset programming entails heating the phase change material to the melting point temperature Tm, also followed by cooling. As shown in the figure, the reset programming heat treatment is carried out for a relative short period of time when compared to that of the set programming. Also, the cooling rate in the reset programming may be more rapid than that of the set programming.

The heat treatment itself is achieved by controlling a write current through the phase change resistor to create joule heating conditions which result in temperature profiles that mirror those illustrated in FIG. 1. As a write current flows through the lower electrode and the switching device of the unit memory cell, joule heat is generated at a boundary surface between the lower electrode and the phase change material film. The joule heating induced temperature of the phase change material film is dependent upon the magnitude and duration of the write current.

As mentioned above, the present disclosure generally relates to methods of forming a phase change material layer using a Ge(II) source and methods of fabricating a phase change memory device.

According to an aspect of the present disclosure, a method of forming a phase change material layer is provided. The method includes supplying a reaction gas including the composition of Formula 1 into a reaction chamber, supplying a first source which includes Ge(II) into the reaction chamber, and supplying a second source into the reaction chamber. Formula 1 is $NR_1R_2R_3$, where $R_1$, $R_2$ and $R_3$ are each independently at least one selected from the group consisting of H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ and $N(C_2H_5)_2$.

According to another aspect of the present disclosure, a method of forming a phase change material layer is provided. The method include supplying a first source including Ge(II) into a reaction chamber, and supplying a second source into the reaction chamber.

According to still another aspect of the present disclosure, a method of fabricating a phase change memory device is provided. The method includes loading a substrate including a lower electrode in a reaction chamber, forming a Ge-containing phase change material layer on the lower electrode by supplying a reaction gas including the composition of Formula 1, a first source including Ge(II), and a second source into the reaction chamber in which the substrate is loaded, and forming an upper electrode on the phase change material layer. Formula 1 is $NR_1R_2R_3$, where $R_1$, $R_2$ and $R_3$ are each independently at least one selected from the group consisting of H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ and $N(C_2H_5)_2$.

BRIEF DESCRIPTION OF THE DRAWINGS

The above and other aspects and features will become readily apparent from the detailed description that follows, with reference to the accompanying drawings, in which.

DETAILED DESCRIPTION OF EMBODIMENTS

Figure 1:
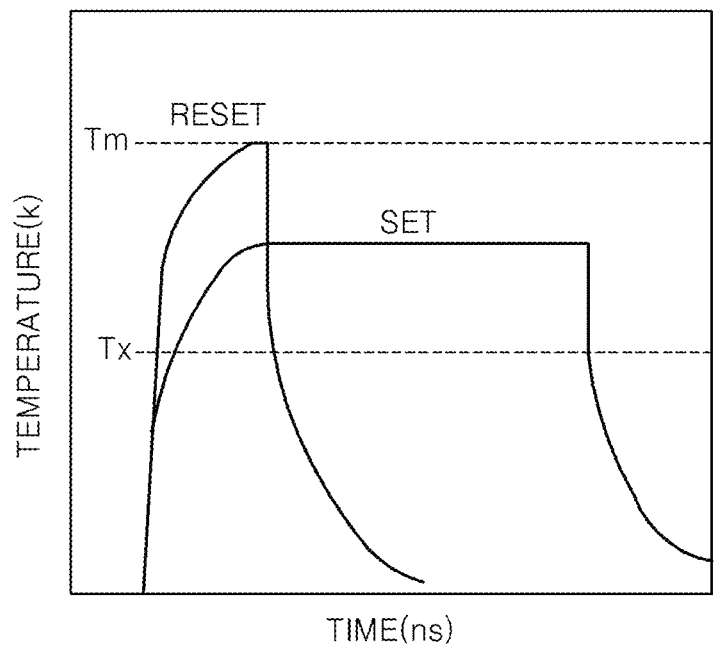
FIG. 1 is a graph illustrating a method of performing a set or reset programming for a phase change resistor.

The present disclosure will now be described more fully with reference to the accompanying drawings, in which exemplary embodiments are shown. The invention may, however, be embodied in many different forms and should not be construed as being limited to the embodiments set forth herein. In the drawings, the relative thicknesses of layers and regions are not necessarily drawn to scale and are exaggerated for clarity. To avoid redundancy in the disclosure, like reference numerals denote the same or similar elements throughout the drawings.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
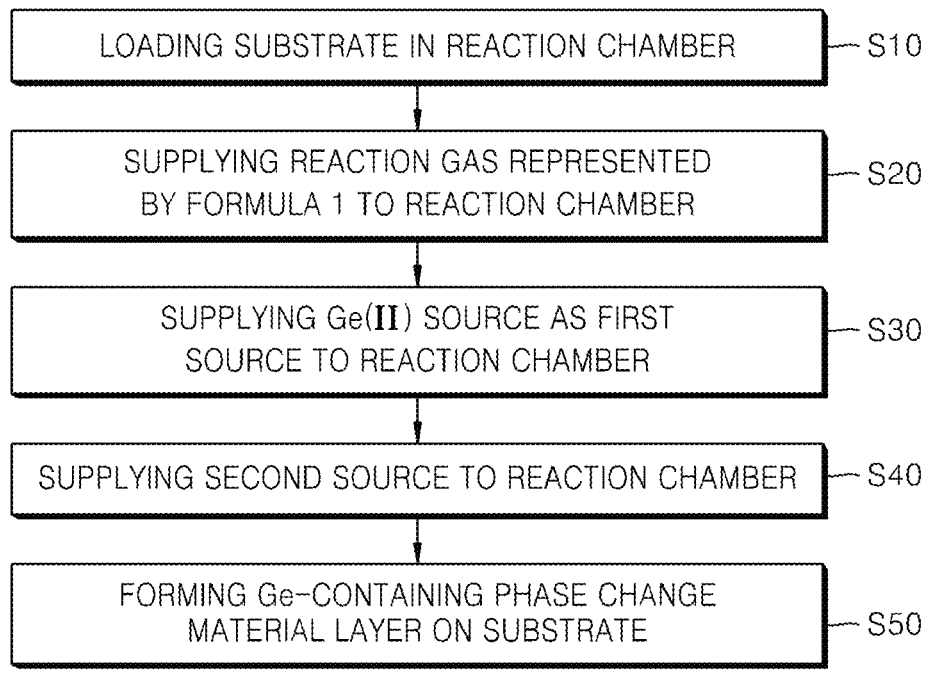
FIG. 2 is a flow chart of a method of forming a Ge-containing phase change material layer according to an exemplary embodiment.

FIG. 2 is a flow chart illustrating a method of forming a phase change material layer according to an exemplary embodiment.

Referring to FIG. 2, a substrate is loaded into a reaction chamber (S10). The substrate may include a semiconductor material or film at a surface thereof. Examples of the semiconductor material or film include Si and/or SiC. In addition, or alternatively, the substrate may include a dielectric and/or conductive material or film at a surface thereof. Examples of the dielectric material or film include silicon oxide, titanium oxide, aluminum oxide ($Al_2O_3$), zirconium oxide, and/or hafnium oxide. Examples of the conductive material or film include Ti, TiN, Al, Ta, TaN, and/or TiAlN.

The reaction chamber may, for example, be a cold wall type reaction chamber or a hot wall type reaction chamber. Generally, a cold wall type reaction chamber is capable of processing a single substrate at a time, and includes a substrate stage having heating wires and a shower head located on the substrate stage. On the other hand, the hot wall type reaction chamber includes heating wires in a wall thereof, such that multiple substrates can be vertically stacked within the chamber and batched processed at the same time. In any event, the embodiment is not limited to any particular type of reaction chamber.

Referring again to the example of FIG. 2, a reaction gas which includes a composition represented by Formula 1 is supplied in to the reaction chamber (S20).

$$NR_1R_2R_3 \hspace{3em} \text{Formula 1}$$

wherein $R_1$, $R_2$ and $R_3$ are each independently H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ or $N(C_2H_5)_2$.

In the preceding paragraph and through this disclosure, the word "independently" means that any two or more of $R_1$, $R_2$ and $R_3$ can be the same as each other, or $R_1$, $R_2$ and $R_3$ can all be different from each other.

The representation of Formula 1 includes non-ring systems, and ring systems in which two or more of $R_1$, $R_2$ and $R_3$ are bonded to each other. In other words, according to Formula 1, two or more of $R_1$, $R_2$ and $R_3$ may or may not be bonded to eachother.

As one particular example, the reaction gas is an $NH_2$ gas. Other specific examples of the reaction gas any one or more of ammonia, primary amine and hydrazine.

Referring again to FIG. 2, a Ge(II) source is supplied as a first source into the reaction chamber (S30). Here, "II" denotes an oxidation state of the Ge is +2. The Ge(II) can be supplied before and/or after and/or at the same time the reaction gas is supplied into the reaction chamber.

The Ge(II) source may, for example, be supplied together with a carrier gas. Examples of the carrier gas include an inert gas such as argon (Ar), helium (He) or nitrogen ($N_2$). As another example, the Ge(II) source may be supplied into the reaction chamber by being dissolved in a solvent and rapidly gasified in a gasifier.

Examples of Ge(II) source include an amide ligand, a phosphanido ligand, an alkoxide ligand or a thiolate ligand.

In the case where the Ge(II) source includes an amide ligand and/or a phosphanido ligand, the Ge(II) source may include a composition represented by Formula 2 below:

$R_1R_2X_1$—Ge—$X_2R_3R_4$          Formula 2 wherein $X_1$ and $X_2$ are each independently at least one of N and P, and wherein $R_1$, $R_2$, $R_3$ and $R_4$ are each independently at least one (i.e., one or a combination of two or more) selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (e) a $C_2$-$C_{12}$ olefinic group, (f) a $C_3$-$C_{12}$ olefinic group, where $CH_3$ is substituted with an imine group, an amine group, an alkoxy group or a ketone group, (g) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (h) a $C_2$-$C_{13}$ acetylenic group, (i) an allenic group ($CHCCH_2$), (j) a cyano group (CN), (k) a NCX group, wherein X is O, S, Se or Te, (l) an azide ligand ($N_3$), (m) an amide ligand ($NR_5R_6$, where $R_5$ and $R_6$ are each independently a hydrogen atom, a $C_1$-$C_{10}$ alkyl group, a $C_2$-$C_{12}$ olefinic group, a $C_2$-$C_{13}$ acetylenic group or an allenic group), and (n) $SiR_7R_8R_9$, where $R_7$, $R_8$ and $R_9$ are each independently a hydrogen atom, a $C_1$-$C_{10}$ alkyl group, a $C_2$-$C_{12}$ olefinic group, a $C_2$-$C_{13}$ acetylenic group or an allenic group.

The representation of Formula 2 includes non-ring systems, and ring-systems in which two or more of $R_1$, $R_2$, $R_3$ and $R_4$ are bonded to each other. In other words, according to Formula 2, two or more of $R_1$, $R_2$, $R_3$ and $R_4$ may or may not be bonded to each other.

In the case where the Ge(II) source includes an alkoxide ligand and/or a thiolate ligand, the Ge(II) source may include a composition represented by Formula 3 below:

$R_1Y_1$—Ge—$Y_2R_2$          Formula 3 wherein $Y_1$ and $Y_2$ are each independently at least one of O and S, and wherein $R_1$ and $R_2$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (e) a $C_2$-$C_{12}$ olefinic group, (f) a $C_3$-$C_{12}$ olefinic group, where $CH_3$ is substituted with an imine group, an amine group, an alkoxy group or a ketone group, (g) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (h) a $C_2$-$C_{13}$ acetylenic group, (i) an allenic group ($CHCCH_2$), (j) a cyano group (CN), (k) a NCX group, where X is O, S, Se or Te, (l) an azide ligand ($N_3$), (m) an amide ligand ($NR_3R_4$, where $R_3$ and $R_4$ are each independently a hydrogen atom, a $C_1$-$C_{10}$ alkyl group, a $C_2$-$C_{12}$ olefinic group, a $C_2$-$C_{13}$ acetylenic group or an allenic group), and (n) $SiR_5R_6R_7$, where $R_5$, $R_6$ and $R_7$ are each independently a hydrogen atom, a $C_1$-$C_{10}$ alkyl group, a $C_2$-$C_{12}$ olefinic group, a $C_2$-$C_{13}$ acetylenic group or an allenic group.

The representation of Formula 2 includes non-ring systems, and ring systems in which $R_1$ and $R_2$ are bonded to each other. In other words, according to Formula 3, $R_1$ and $R_2$ may or may not be bonded to each other.

In the case where the Ge(II) source includes one of the amide ligand and the phosphanido ligand; and one of the alkoxide ligand and the thiolate ligand, the Ge(II) may include a composition represented by Formula 4 below:

$R_1R_2X$—Ge—$YR_3$          Formula 4 wherein X is at least one of N and P, wherein Y is at least one of O and S, and wherein $R_1$, $R_2$ and $R_3$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (e) a $C_2$-$C_{12}$ olefinic group, (f) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (g) a $C_2$-$C_{13}$ acetylenic group, (h) an allenic group ($CHCCH_2$), (i) a cyano group (CN), (j) a NCX group, where X is O, S, Se or Te, (k) an azide ligand ($N_3$), (l) an amide ligand ($NR_4R_5$, where $R_4$ and $R_5$ are each independently a hydrogen atom, a $C_1$-$C_{10}$ alkyl group, a $C_2$-$C_{12}$ olefinic group, a $C_2$-$C_{13}$ acetylenic group or an allenic group), and (m) $SiR_6R_7R_8$, where $R_6$, $R_7$ and $R_8$ are each independently a hydrogen atom, a $C_1$-$C_{10}$ alkyl group, a $C_2$-$C_{12}$ olefinic group, a $C_2$-$C_{13}$ acetylenic group or an allenic group.

The representation of Formula 4 includes non-ring systems, and ring systems in which two or more of $R_1$, $R_2$ and $R_3$ are bonded to each other. In other words, according to Formula 4, two or more of $R_1$, $R_2$ and $R_3$ may or may not be bonded to eachother.

Examples of Ge(II) source compositions represented by Formula 2 are presented below as Formulae 5 to 11:

Formula 5 wherein $X_1$ and $X_2$ are each independently N or P, and wherein $R_1$, $R_2$, $R_3$ and $R_4$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

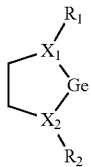

Formula 6 wherein $X_1$ and $X_2$ are each independently N or P, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

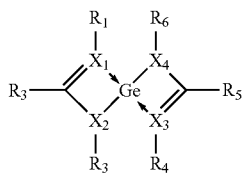

Formula 7 wherein $X_1$, $X_2$, $X_3$ and $X_4$ are each independently N or P, and wherein $R_1$, $R_2$, $R_3$, $R_4$, $R_5$ and $R_6$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

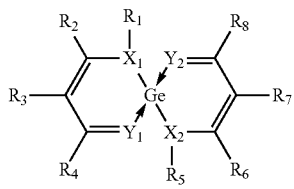

Formula 8 wherein $X_1$ and $X_2$ are each independently N or P, wherein $Y_1$ and $Y_2$ are each independently O or S, and wherein $R_1$, $R_2$, $R_3$, $R_4$, $R_5$, $R_6$, $R_7$ and $R_8$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

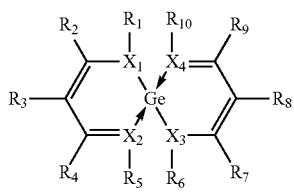

Formula 9 wherein $X_1$, $X_2$, $X_3$ and $X_4$ are each independently N or P, and wherein $R_1$, $R_2$, $R_3$, $R_4$, $R_5$, $R_6$, $R_7$, $R_8$, $R_9$ and $R_{10}$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

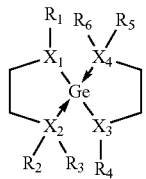

Formula 10 wherein $X_1$, $X_2$, $X_3$ and $X_4$ are each independently N or P, and wherein $R_1$, $R_2$, $R_3$, $R_4$, $R_5$ and $R_6$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group; and

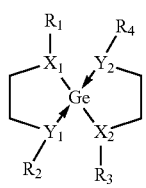

Formula 11 wherein $X_1$ and $X_2$ are each independently N or P, wherein $Y_1$ and $Y_2$ are each independently O or S, and wherein $R_1$, $R_2$, $R_3$ and $R_4$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group.

Examples of Ge(II) source compositions represented by Formula 3 are presented below as Formulae 12 to 16:

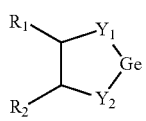

Formula 12 wherein $Y_1$ and $Y_2$ are each independently O or S, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

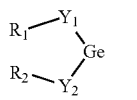

Formula 13 wherein $Y_1$ and $Y_2$ are each independently O or S, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

Formula 14 wherein $Y_1$, $Y_2$, $Y_3$ and $Y_4$ are each independently O or S, and wherein $R_1$, $R_2$, $R_3$, $R_4$, $R_5$ and $R_6$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

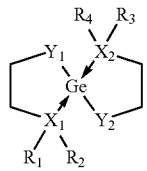

Formula 15 wherein $X_1$ and $X_2$ are each independently N or P, wherein $Y_1$ and $Y_2$ are each independently O or S, and wherein $R_1$, $R_2$, $R_3$ and $R_4$ are each independently selected from the group consisting of a hydrogen atom, a $C_1$-$C_{10}$ alkyl group, a $C_2$-$C_{12}$ olefinic group, a $C_2$-$C_{13}$ acetylenic group and an allenic group; and

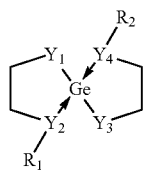

Formula 16 wherein $Y_1$, $Y_2$, $Y_3$ and $Y_4$ are each independently O or S, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group.

An example of a Ge(II) source composition represented by Formula 4 is presented below as Formulae Formula 17:

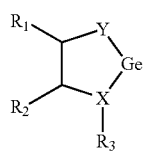

Formula 17 wherein X is N or P, wherein Y is O or S, and wherein $R_1$, $R_2$ and $R_3$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group.

When compared to a Ge(IV) source, the Ge(II) sources described above exhibit fewer ligands and a weaker covalent bond property between the Ge and the ligands. According, steric hindrance caused by ligands is relatively weak in the Ge(II) source. Even when the number of ligands of the Ge(II) source and Ge(IV) source is the same, a dative bond among the Ge-ligand bonds of the Ge(II) source may be relatively easily disconnected by heat of the reaction chamber, and thus the Ge(II) source is transformed to a structure with low steric hindrance due to the reduced number of the ligands linked to Ge. Accordingly, the Ge(II) source exhibits improved reactivity when compared to the Ge(IV) source, and thus a temperature required to form the phase change material layer can be reduced.

In particular, for example, the Ge(II) source represented by Formulae 5, 6, 12, 13 and 17 has two atoms linked to Ge, and thus steric hindrance is relatively low. The Ge(II) source represented by Formulae 7, 8, 9 and 14 has four atoms linked to Ge, but the steric hindrance is still relatively low since the top and bottom of the Ge are sterically opened since two ligands of both sides of Ge are almost in the same plane. The Ge(II) source represented by Formulae 10, 11, 15 and 16 also has four atoms linked to Ge, but the steric hindrance is also relatively low since the Ge(II) source is transformed to a structure having two atoms linked to Ge because a dative bond among the Ge-ligand bonds is easily disconnected by heat of the reaction chamber as shown in Reaction Schemes 1 to 4.

Reaction Scheme 1

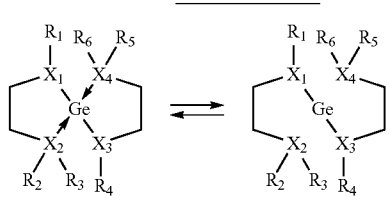

In Reaction Scheme 1, $X_1$, $X_2$, $X_3$ and $X_4$ are each independently N or P, and $R_1$, $R_2$, $R_3$, $R_4$, $R_5$ and $R_6$ are each independently a hydrogen atom, a $C_1$-$C_{10}$ alkyl group, a $C_2$-$C_{12}$ olefinic group, a $C_2$-$C_{13}$ acetylenic group or an allenic group.

Reaction Scheme 2

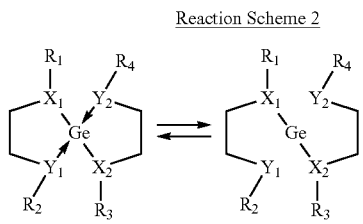

In Reaction Scheme 2, $X_1$ and $X_2$ are each independently N or P, $Y_1$ and $Y_2$ are each independently O or S, and $R_1$, $R_2$, $R_3$ and $R_4$ are each independently a hydrogen atom, a $C_1$-$C_{10}$ alkyl group, a $C_2$-$C_{12}$ olefinic group, a $C_2$-$C_{13}$ acetylenic group or an allenic group.

Reaction Scheme 3

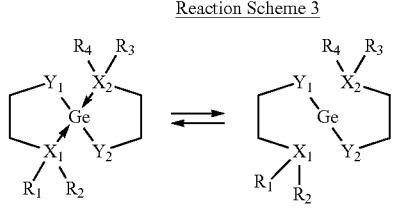

In Reaction Scheme 3, $X_1$ and $X_2$ are each independently N or P, $Y_1$ and $Y_2$ are each independently O or S, and $R_1$, $R_2$, $R_3$ and $R_4$ are each independently a hydrogen atom, a $C_1$-$C_{10}$ alkyl group, a $C_2$-$C_{12}$ olefinic group, a $C_2$-$C_{13}$ acetylenic group or an allenic group.

Reaction Scheme 4

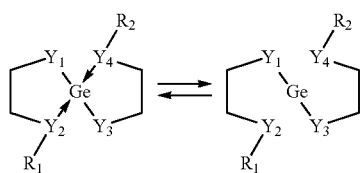

In Reaction Scheme 4, $Y_1$, $Y_2$, $Y_3$ and $Y_4$ are each independently O or S, and $R_1$ and $R_2$ are each independently a hydrogen atom, a $C_1$-$C_{10}$ alkyl group, a $C_2$-$C_{12}$ olefinic group, a $C_2$-$C_{13}$ acetylenic group or an allenic group.

Returning once again to FIG. 2, a second source is supplied into the reaction chamber (S40). The second source may be supplied before or after the reaction gas and/or the Ge(II) source is supplied, or simultaneously with the reaction gas and the Ge(II) source. As a result, a Ge-containing phase change material layer is formed on the substrate (S50).

The second source may also be supplied into the reaction chamber with a carrier gas. Examples of the carrier gas include an inert gas such as argon (Ar), helium (He) or nitrogen ($N_2$). As an alternative example, the second source may be supplied into the reaction chamber by being dissolved in a solvent and rapidly gasified in a gasifier.

Examples of the second source include one or more of a Te source, a Sb source, a Bi source, an As source, a Sn source, an O source, an Au source, a Pd source, a Se source, a Ti source and a S source. The resultant Ge-containing phase change material layer may, for example, be formed as a Ge—Sb—Te layer, Ge—Bi—Te layer, Ge—Sb layer, Ge—Te—As layer, Ge—Te—Sn layer, Ge—Te layer, Ge—Te—Sn—O layer, Ge—Te—Sn—Au layer, Ge—Te—Sn—Pd layer, Ge—Te—Se layer, Ge—Te—Ti layer, (Ge, Sn)—Sb—Te layer, Ge—Sb—(Se, Te) layer or Ge—Sb—Te—S layer. The Ge-containing phase change material layer may also include one or more impurities such as N, O, Bi, Sn, B, Si or a combination thereof.

For example, when a Te source and/or a Sb source is supplied as the second source, the Ge-containing phase change material layer formed on the substrate may be Ge—Sb—Te layer, Ge—Te layer or Ge—Sb layer. Specific examples of the Te source include $Te(CH_3)_2$, $Te(C_2H_5)_2$, $Te(n-C_3H_7)_2$, $Te(i-C_3H_7)_2$, $Te(t-C_4H_9)_2$, $Te(i-C_4H_9)_2$, $Te(CH=CH_2)_2$, $Te(CH_2CH=CH_2)_2$, or $Te[N(Si(CH_3)_3)_2]_2$. Specific examples of the Sb source include $Sb(CH_3)_3$, $Sb(C_2H_5)_3$, $Sb(i-C_3H_7)_3$, $Sb(n-C_3H_7)_3$, $Sb(i-C_4H_9)_3$, $Sb(t-C_4H_9)_3$, $Sb(N(CH_3)_2)_3$, $Sb(N(CH_3)(C_2H_5))_3$, $Sb(N(C_2H_5)_2)_3$, $Sb(N(i-C_3H_7)_2)_3$ or $Sb[N(Si(CH_3)_3)_2]_3$.

The Ge(II) source may react with the reaction gas to form a Ge(II) intermediate in which ligands neighboring the Ge are substituted by the reaction gas. The Ge(II) intermediate may include two $NR_1R_2$ ligands, wherein $R_1$ and $R_2$ are each independently H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ or $N(C_2H_5)_2$ around Ge. Here, since reactivity between the Ge(II) source and the reaction gas is improved when compared to the reactivity between the Ge(IV) source and the reaction gas, the reaction temperature may be reduced. For example, the Ge(II) source represented by Formula 5 reacts with ammonia to form a Ge(II) intermediate as shown in Reaction Scheme 5 below.

Reaction Scheme 5

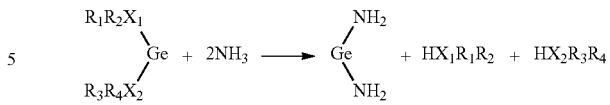

In Reaction Scheme 5, $X_1$ and $X_2$ are each independently N or P, and $R_1$, $R_2$, $R_3$ and $R_4$ are each independently a hydrogen atom, a $C_1$-$C_{10}$ alkyl group, a $C_2$-$C_{12}$ olefinic group, a $C_2$-$C_{13}$ acetylenic group or an allenic group.

The Ge(II) intermediate may react with the second source to form a Ge-containing phase change material layer. For example, the Ge(II) intermediate prepared according to Reaction Scheme 5 reacts with a Te source to form a phase change material layer as shown in Reaction Scheme 6 below.

Reaction Scheme 6

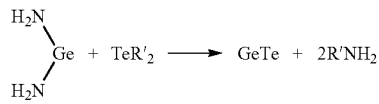

In Reaction Scheme 6, R' is $CH(CH_3)_2$.

The Ge(II) intermediate is highly reactive with the second source. Further, similar to the Ge(II) source, the Ge(II) intermediate exhibits low steric hindrance by ligands. As a result, the reaction temperature may be further reduced, and the deposition temperature of the Ge-containing phase change material layer may be reduced. For example, the deposition temperature of the Ge-containing phase change material layer may be less than 300° C., and further, may be 200° C. or less. The grain size of a phase change material layer deposited at such a low temperature is smaller than that of a phase change material layer deposited at a higher temperature. A smaller grain size improves step coverage, which allows a conformal phase change material layer to be formed on the side wall of a contact hole or trench without blocking the hole or trench inlet, thereby avoid the formation of voids within the hole or trench.

The Ge-containing phase change material layer may, for example, be formed using chemical vapor deposition (CVD) or atomic layer deposition (ALD).

Figure 3:
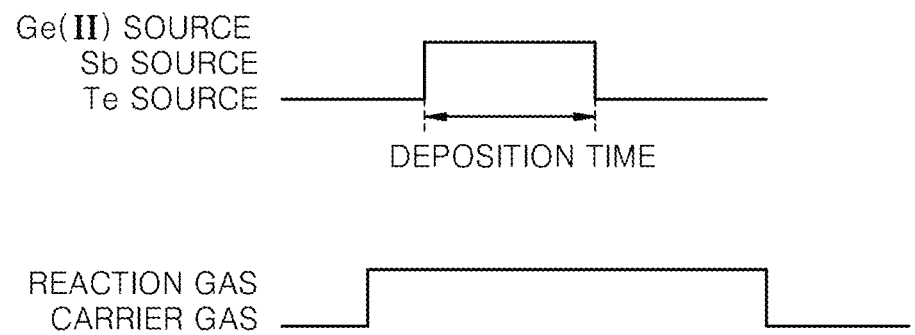
FIG. 3 is a gas pulsing diagram for use in describing the formation of a Ge—Sb—Te layer using chemical vapor deposition according to an exemplary embodiment.

FIG. 3 is an example of a gas pulsing diagram in the case where a Ge—Sb—Te layer is formed using chemical vapor deposition.

Referring to FIG. 3, a Ge(II) source, a Sb source and a Te source are simultaneously supplied into a reaction chamber while a carrier gas and a reaction gas are supplied into the reaction chamber. The first reaction gas may be $NR_1R_2R_3$, wherein $R_1$, $R_2$ and $R_3$ are each independently H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ or $N(C_2H_5)_2$. As particular examples, the reaction gas may be ammonia, primary amine or hydrazine. The carrier gas may, for example, be an inert gas such as argon (Ar), helium (He) or nitrogen ($N_2$). The Ge(II) source may be a Ge(II) source as previous described, and may include, for example, an amide ligand, a phosphanido ligand, an alkoxide ligand or a thiolate ligand. The Ge(II) source may react with the reaction gas to form a Ge(II) intermediate in which ligands neighboring Ge are substituted with ligands associated with the reaction gas, and the Ge(II) intermediate may react with the Te source to form GeTe. In addition, the Te source reacts with the Sb source to form $Sb_2Te_3$. The GeTe and the $Sb_2Te_3$ can form a Ge—Sb—Te layer having $Ge_2Sb_2Te_5$ composition. Here, since reactivity between the Ge(II) source and the reaction gas and reactivity between the Ge(II) intermediate and the Te source are improved, a temperature required to deposit GeTe may be reduced. Each of the Ge(II) source, the Sb source and the Te source may be injected at 10 to 1000 sccm for 1 to 1000 seconds. The time for injecting the Ge(II) source, the Sb source and the Te source into the reaction chamber may be defined as deposition time.

Figure 4:
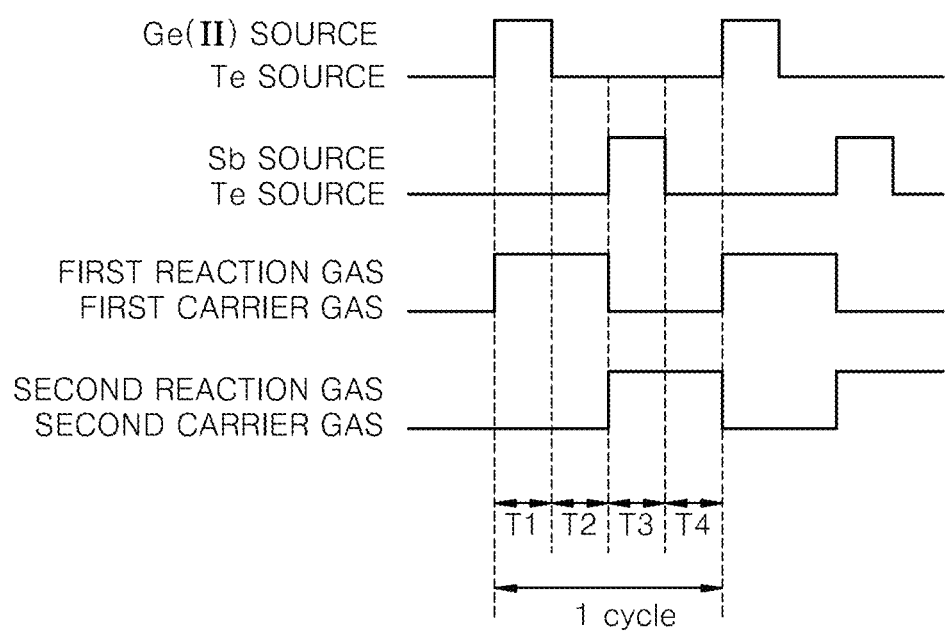
FIG. 4 is a gas pulsing diagram for use in describing the formation of a Ge—Sb—Te layer using atomic layer deposition according to an exemplary embodiment.

FIG. 4 is an example of a gas pulsing diagram in the case where a Ge—Sb—Te layer is formed using atomic layer deposition.

Referring to FIG. 4, a Ge(II) source and a Te source are injected to a reaction chamber while a first carrier gas and a first reaction gas are supplied to the reaction chamber for time T1 to form a Ge—Te layer (first operation). The first reaction gas may be $NR_1R_2R_3$, wherein $R_1$, $R_2$ and $R_3$ are each independently H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ or $N(C_2H_5)_2$. As particular examples, the reaction gas may be ammonia, primary amine or hydrazine. The first carrier gas may, for example, include an inert gas such as argon (Ar), helium (He) or nitrogen ($N_2$). The Ge(II) source may include a Ge(II) source as described previously, and may include amide ligand, a phosphanido ligand, an alkoxide ligand or a thiolate ligand. The Ge(II) source may react with the first reaction gas to form a Ge(II) intermediate in which ligands neighboring Ge are substituted with ligands associated with the reaction gas, and the Ge(II) intermediate may react with the Te source to form GeTe. Here, since reactivity between the Ge(II) source and the first reaction gas and reactivity between the Ge(II) intermediate and the Te source are improved, a temperature required to deposit GeTe may be reduced.

Then, physically adsorbed Ge(II) source and Te source; and unreacted Ge(II) source and Te source are removed by supplying the first carrier gas and the first reaction gas to the reaction chamber while the supply of the sources is suspended for time T2 (second operation).

A Sb source and a Te source are injected to the reaction chamber while supplying a second carrier and a second reaction gas to the reaction chamber for time T3 to form a Sb—Te layer, for example, a $Sb_2Te_3$ layer (third operation). The second reaction gas may independently include hydrogen ($H_2$), oxygen ($O_2$), ozone ($O_3$), water vapor ($H_2O$), silane ($SiH_4$), diborane ($B_2H_6$), hydrazine ($N_2H_4$), primary amine or ammonia ($NH_3$), and the second carrier gas may independently include an inert gas such as argon (Ar), helium (He) or nitrogen ($N_2$).

Physically adsorbed Sb source and Te source, and unreacted Sb source and Te source are removed by supplying the second carrier gas and the second reaction gas to the reaction chamber while the supply of the sources is suspended for time T4 (fourth operation).

A unit cycle including the first to fourth operations (T1~T4) may be repeated to form a Ge—Sb—Te layer, for example, a Ge—Sb—Te layer having $Ge_2Sb_2Te_5$ composition. Each of the Ge(II) source, the Sb source and the Te source may be injected at 10 to 1000 sccm for 0.1 to 60 seconds.

Figure 5A:
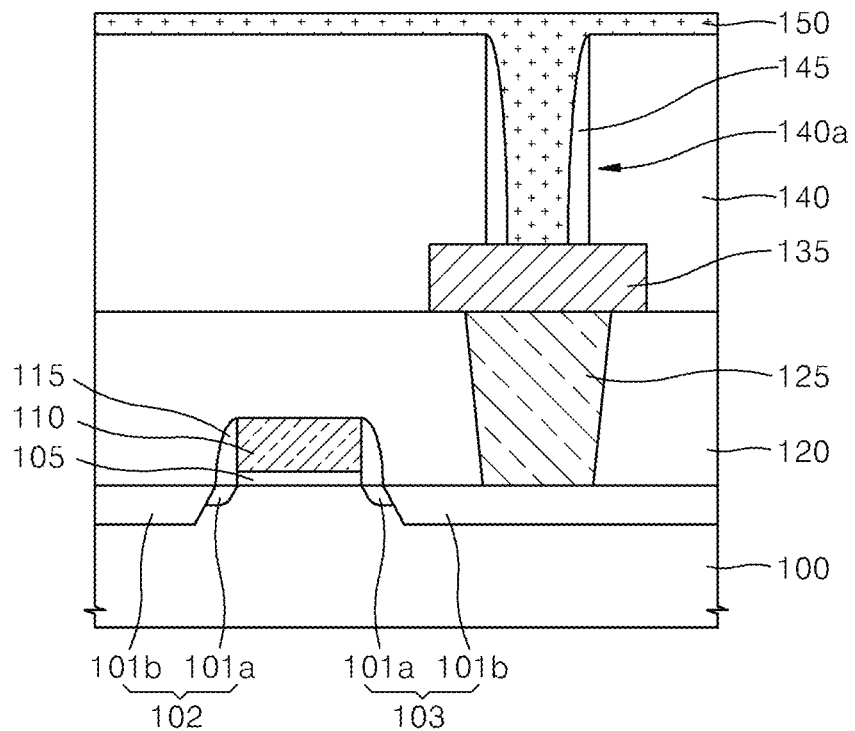
FIGS. 5A and 5B are cross-sectional views of phase change memory devices prepared according to a method of fabricating a phase change memory device according to an exemplary embodiment.
Figure 5B:
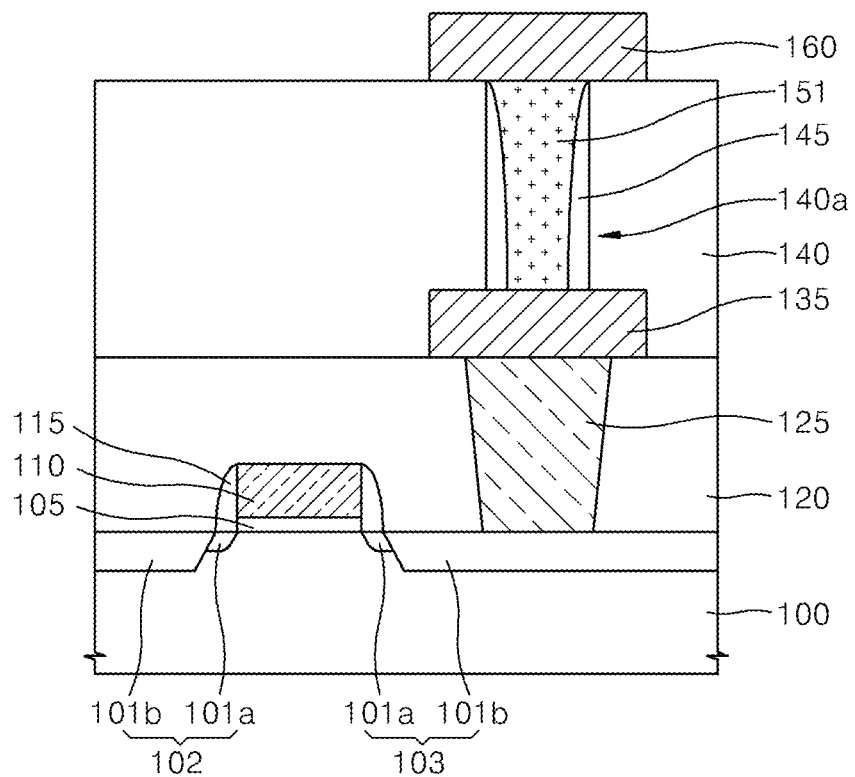

FIGS. 5A and 5B are cross-sectional views of phase change memory devices prepared according to a method of fabricating a phase change memory device according to an exemplary embodiment.

Referring to FIG. 5A, an isolation layer (not shown) is formed on a substrate 100 to define an active region. A gate insulating layer 105 and a gate conductive layer are sequentially stacked on the active region, and the gate conductive layer 110 and the gate insulating layer 105 are etched to form a gate electrode 110. Impurities are doped on the substrate 100 to a low concentration using the gate electrode 110 as a mask to form a low concentration impurity region 101a neighboring the gate electrode 110 in the substrate 100.

A gate spacer insulating layer is stacked on the substrate 100 on which the low concentration impurity region 101a is formed, and the gate spacer insulating layer is anisotropically etched to form a gate spacer 115 on the side wall of the gate electrode 110. Then, impurities are doped on the substrate 100 to a high concentration using the gate electrode 110 and the gate spacer 115 as masks to form a high concentration impurity region 101b neighboring the gate spacer 115 in the substrate 100.

The low concentration impurity region 101a and the high concentration impurity region 101b form source/drain regions. The low concentration impurity region 101a and the high concentration impurity region 101b of one end of the gate electrode 110 form a source region 102, and the low concentration impurity region 101a and the high concentration impurity region 101b of the other end of the gate electrode 110 form a drain region 103. The gate electrode 110, the source region 102 and the drain region 103 constitute a MOS transistor which functions as an access device. However, the access device is not limited to the MOS transistor, and may instead be a diode or a bipolar transistor.

A first interlayer insulating layer 120 is formed on the substrate 100 on which the source/drain regions 102 and 103 are formed, and a contact plug 125 passing through the first interlayer insulating layer 120 and connected to the drain region 103 is formed within the first interlayer insulating layer 120. The contact plug 125 may, for example, be formed of a tungsten layer.

A lower electrode 135 covering the contact plug 125 is formed on the contact plug 125. The lower electrode 135 may, for example, be formed of a titanium nitride layer (TiN), a titanium aluminum nitride layer (TiAlN), a tantalum nitride layer (TaN), a tungsten nitride layer (WN), a molybdenum nitride layer (MoN), a niobium nitride layer (NbN), a titanium silicon nitride layer (TiSiN), a titanium boron nitride layer (TiBN), a zirconium silicon nitride layer (ZrSiN), a tungsten silicon nitride layer (WSiN), a tungsten boron nitride layer (WBN), a zirconium aluminum nitride layer (ZrAlN), a molybdenum aluminum nitride layer (MoAlN), a tantalum silicon nitride layer (TaSiN), a tantalum aluminum nitride layer (TaAlN), a titanium tungsten layer (TiW), a titanium aluminum layer (TiAl), a titanium oxynitride layer (TiON), a titanium aluminum oxynitride layer (TiAlON), a tungsten oxynitride layer (WON) or a tantalum oxynitride layer (TaON).

A mold insulating layer 140 is formed on the lower electrode 135, and a via hole 140a which exposes a part of the lower electrode 135 is formed within the mold insulating layer 140. A hole spacer insulating layer is formed on the substrate on which the via hole 140a is formed, and the hole spacer insulating layer is anisotropically etched to expose the lower electrode 135 in the via hole 140a. Thus, a hole spacer 145 is formed on the side wall of the via hole 140a. Accordingly, an effective diameter of the via hole 140a may be less than a resolution limit of lithography due to the hole spacer 145.

Then, a phase change material layer 150 is formed on the substrate on which the via hole 140a is formed. The phase change material layer 150 may be a Ge-containing phase change material layer, and formed using the method of FIG. 2. Thus, the deposition temperature of the phase change material layer 150 may be reduced to less than 300° C. Furthermore, the deposition temperature of the phase change material layer 150 may be reduced to 200° C. The phase change material layer 150 deposited at such as low temperature has less grain size than a phase change material layer deposited at a high temperature. Thus, the phase change material layer 150 can fill the via hole 140a without voids even when the effective diameter of the via hole 140a is extremely small.

Referring to FIG. 5B, a phase change material pattern 151 is formed by planarizing the phase change material layer 150. An upper electrode 160 is formed on the phase change material pattern 151. The phase change material layer 150 may be planarized using etch back or chemical mechanical polishing (CMP). As a result, a phase change resistor including the lower electrode 135, the upper electrode 160 and the phase change material pattern 151 interposed between the lower electrode 135 and the upper electrode is formed.

Figure 6A:
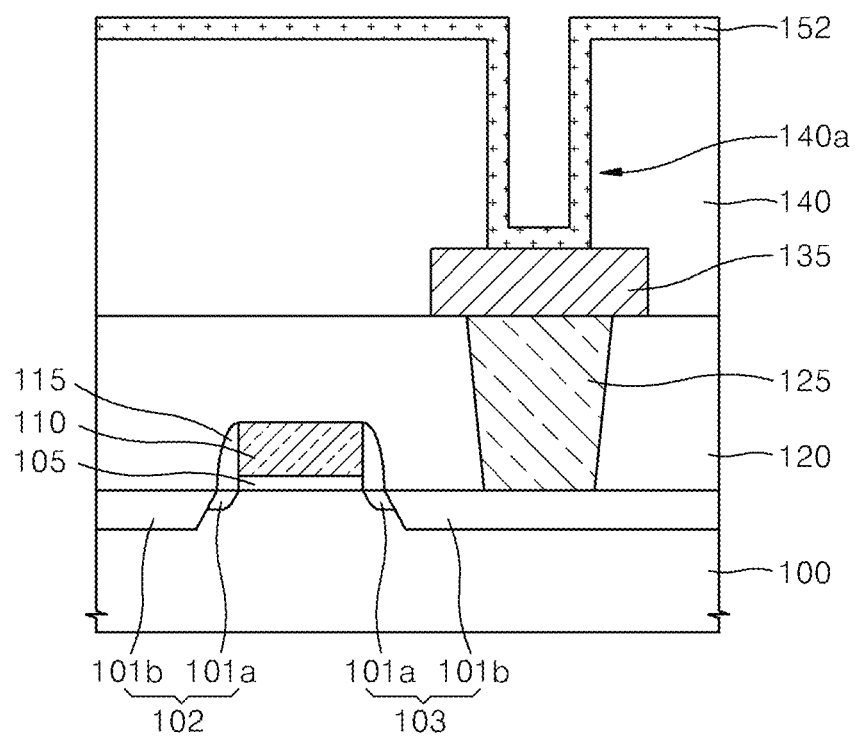
FIGS. 6A, 6B and 6C are cross-sectional views of phase change memory devices prepared according to a method of fabricating a phase change memory device according to another exemplary embodiment.
Figure 6B:
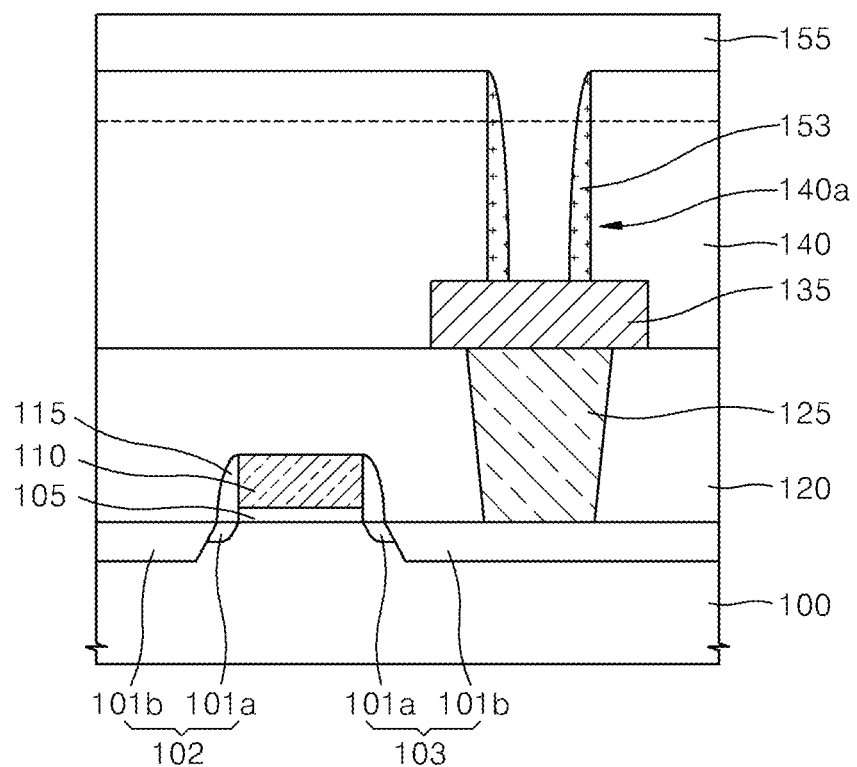
Figure 6C:
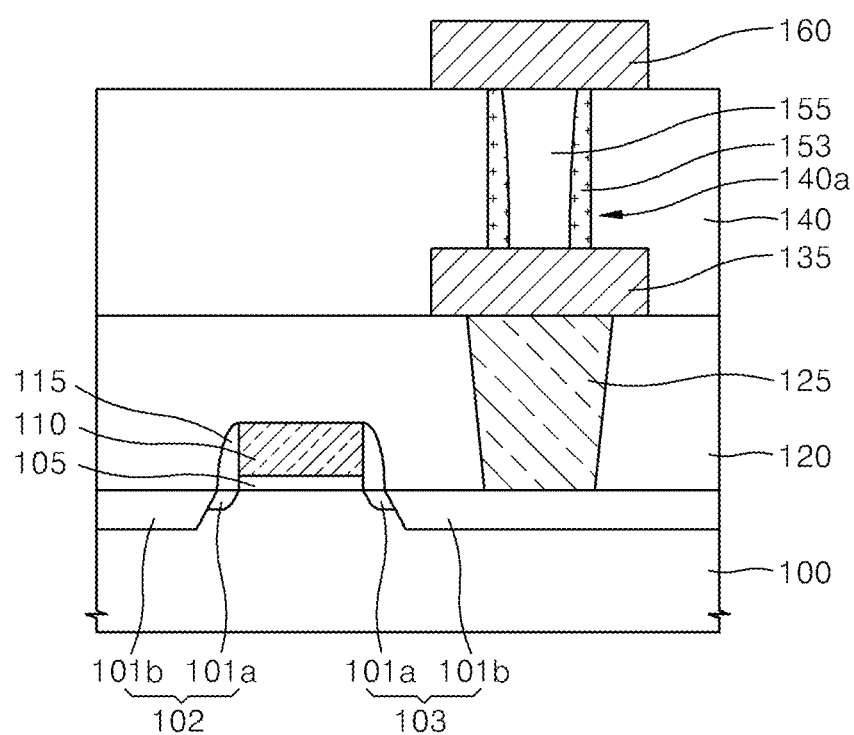

FIGS. 6A, 6B and 6C are cross-sectional views of phase change memory devices prepared according to a method of fabricating a phase change memory device according to another exemplary embodiment. The method of FIGS. 6A~6C is similar to that of FIGS. 5A and 5B, and accordingly, to avoid redundancy in the description, a discussion of like aspects between the two methods is omitted below.

Referring to FIG. 6A, a mold insulating layer 140 is formed on the lower electrode 135, and a via hole 140a which exposes a part of the lower electrode 135 is formed within the mold insulating layer 140. A phase change material layer 152 is formed in the via hole 140a. The phase change material layer 152 does not fully fill the via hole 140a, but is formed to conformally cover the side wall of the via hole 140a. The phase change material layer 152 may be a Ge-containing phase change material layer, and formed using the method of FIG. 2. Thus, the deposition temperature of the phase change material layer 152 may be reduced to less than 300° C. Furthermore, the deposition temperature of the phase change material layer 152 may be reduced to 200° C. The phase change material layer 152 deposited at such as low temperature has less grain size than a phase change material layer deposited at a high temperature. Thus, the phase change material layer 152 can conformally cover the side wall of the via hole 140a without blocking the upper portion of the via hole 140a.

Referring to FIG. 6B, the phase change material layer 152 is anisotropically etched until the lower electrode 135 is exposed to form a phase change material spacer 153 on the side wall of the via hole 140a and to expose the upper surface of the mold insulating layer 140. A buffer insulating layer 155 is formed on the exposed lower electrode 135 and the mold insulating layer 140. The buffer insulating layer 155 is formed to fill the via hole 140a. In the via hole 140a, the side wall of the buffer insulating layer 155 is covered by the phase change material spacer 153.

The substrate on which the buffer insulating layer 155 is formed is planarized to expose the upper surface of the phase change material spacer 153. For example, the substrate may be planarized to the dashed line shown in FIG. 6B.

Referring to FIG. 6C, an upper electrode 160 is formed on the phase change material spacer 153, the upper surface of which is exposed. Thus, a phase change resistor including the lower electrode 135, the upper electrode 160 and the phase change material spacer 153 interposed between the lower electrode 135 and the upper electrode 160 is formed. The contact area between the phase change material spacer 153 and the lower electrode 135 may be reduced when compared to the phase change material pattern described with reference to FIG. 5B. Accordingly, an effective current density of a writing current applied to the phase change material spacer 153 may further be increased.

Described next are a number of Experimental Examples (1~13) and Comparative Examples (1~2).

Experimental Example 1

A substrate was loaded in a reaction chamber. Ar as a carrier gas was supplied into the reaction chamber at 500 sccm and $NH_3$ as a reaction gas was supplied into the reaction chamber at 100 sccm. A Ge(II) source represented by Formula 18 below was supplied into the reaction chamber at 100 sccm. Simultaneously, $Te(CH(CH_3)_2)_2$ was supplied into the reaction chamber at 100 sccm to form a GeTe layer on the substrate. The supply of the Ge(II) source and the $Te(CH(CH_3)_2)_2$ was performed for 900 seconds. The temperature of a heater of the reaction chamber was set to 320° C.

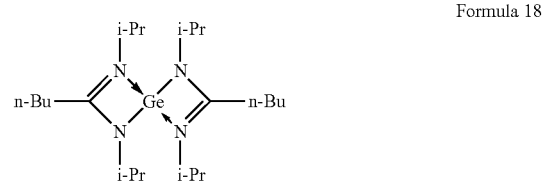

Formula 18

Experimental Example 2

A GeTe layer was formed on the substrate in the same manner as in Experimental Example 1, except that the temperature of a heater of the reaction chamber was set to 280° C.

Experimental Example 3

A GeTe layer was formed on the substrate in the same manner as in Experimental Example 1, except that the temperature of a heater of the reaction chamber was set to 240° C.

Experimental Example 4

A GeTe layer was formed on the substrate in the same manner as in Experimental Example 1, except that the temperature of a heater of the reaction chamber was set to 200° C.

Experimental Example 5

A substrate was loaded in a reaction chamber. Ar as a carrier gas was supplied into the reaction chamber at 500 sccm and $NH_3$ as a reaction gas was supplied into the reaction chamber at 100 sccm. A Ge(II) source represented by Formula 19 below was supplied into the reaction chamber at 100 sccm. Simultaneously, $Te(CH(CH_3)_2)_2$ was supplied into the reaction chamber at 100 sccm to form a GeTe layer on the substrate. The supply of the Ge(II) source and the $Te(CH(CH_3)_2)_2$ was performed for 900 seconds. The temperature of a heater of the reaction chamber was set to 320° C.

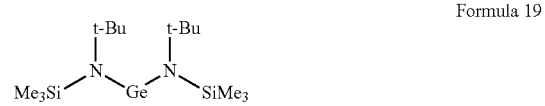

Formula 19

Experimental Example 6

A GeTe layer was formed on the substrate in the same manner as in Experimental Example 5, except that the temperature of a heater of the reaction chamber was set to 280° C.

Experimental Example 7

A GeTe layer was formed on the substrate in the same manner as in Experimental Example 5, except that the temperature of a heater of the reaction chamber was set to 240° C.

Experimental Example 8

A substrate was loaded in a reaction chamber. Ar as a carrier gas was supplied into the reaction chamber at 500 sccm and $H_2$ as a reaction gas was supplied into the reaction chamber at 100 sccm. A Ge(II) source represented by Formula 18 was supplied into the reaction chamber at 100 sccm. Simultaneously, $Te(CH(CH_3)_2)_2$ was supplied into the reaction chamber at 100 sccm to form a GeTe layer on the substrate. The supply of the Ge(II) source and the $Te(CH(CH_3)_2)_2$ was performed for 900 seconds. The temperature of a heater of the reaction chamber was set to 320° C.

Experimental Example 9

A GeTe layer was formed on the substrate in the same manner as in Experimental Example 8, except that the temperature of a heater of the reaction chamber was set to 280° C.

Experimental Example 10

A GeTe layer was formed on the substrate in the same manner as in Experimental Example 8, except that the temperature of a heater of the reaction chamber was set to 240° C.

Experimental Example 11

A substrate was loaded in a reaction chamber. Ar as a carrier gas was supplied into the reaction chamber at 500 sccm and $H_2$ as a reaction gas was supplied into the reaction chamber at 100 sccm. A Ge(II) source represented by Formula 19 was supplied into the reaction chamber at 100 sccm. Simultaneously, $Te(CH(CH_3)_2)_2$ was supplied into the reaction chamber at 100 sccm to form a GeTe layer on the substrate. The supply of the Ge(II) source and the $Te(CH(CH_3)_2)_2$ was performed for 900 seconds. The temperature of a heater of the reaction chamber was set to 320° C.

Experimental Example 12

A GeTe layer was formed on the substrate in the same manner as in Experimental Example 11, except that the temperature of a heater of the reaction chamber was set to 280° C.

Experimental Example 13

A GeTe layer was formed on the substrate in the same manner as in Experimental Example 11, except that the temperature of a heater of the reaction chamber was set to 240° C.

Comparative Example 1

A substrate was loaded in a reaction chamber. Ar as a carrier gas was supplied into the reaction chamber at 500 sccm and $NH_3$ as a reaction gas was supplied into the reaction chamber at 100 sccm. $Ge(N(CH_3)_2)_4$ as a Ge(IV) source was supplied into the reaction chamber at 100 sccm. Simultaneously, $Te(CH(CH_3)_2)_2$ was supplied into the reaction chamber at 100 sccm to form a GeTe layer on the substrate. The supply of the Ge(IV) source and the $Te(CH(CH_3)_2)_2$ was performed for 900 seconds. The temperature of a heater of the reaction chamber was set to 320° C.

Comparative Example 2

A GeTe layer was formed on the substrate in the same manner as in Comparative Example 1, except that the temperature of a heater of the reaction chamber was set to 280° C.

Experimental conditions of Experimental Examples 1 to 13, and Comparative Examples 1 and 2, and deposition rates of the resultant GeTe layers are shown in Table 1 below.

TABLE 1

| | Ge source | Reaction gas | Heater temperature in reaction chamber (° C.) | Deposition rate of $Sb_2Te_3$ layer (Å/min) |
|---|---|---|---|---|
| Experimental Example 1 | Ge(II) source of Formula 18 | $NH_3$ | 320 | 12 |
| Experimental Example 2 | | | 280 | 10 |
| Experimental Example 3 | | | 240 | 7 |
| Experimental Example 4 | | | 200 | 3 |
| Experimental Example 5 | Ge(II) source of Formula 19 | | 320 | 8 |
| Experimental Example 6 | | | 280 | 4 |
| Experimental Example 7 | | | 240 | 2 |
| Comparative Example 1 | Ge(IV) source $Ge(N(CH_3)_2)_4$ | | 320 | Deposited |
| Comparative Example 2 | | | 280 | Not deposited |
| Experimental Example 8 | Ge(II) source of Formula 18 | $H_2$ | 320 | 4 |
| Experimental Example 9 | | | 280 | 0.7 |
| Experimental Example 10 | | | 240 | 0.1 |
| Experimental Example 11 | Ge(II) source of Formula 19 | | 320 | 3 |
| Experimental Example 12 | | | 280 | 0.8 |
| Experimental Example 13 | | | 240 | 0.1 |

Referring to Table 1, when the reaction gas was $NH_3$, a phase change material layer was formed at a temperature less than 300° C., that is, at 280° C., at 240° C., and even at 200° C. using the Ge(II) source of Formula 18. However, when using the Ge(IV) source, a phase change material layer was not formed at a temperature less than 300° C. A phase change material layer was also be formed at a temperature less than 300° C., that is, at 280° C. and at 240° C. using the Ge(II) source of Formula 19.

When the reaction gas was $H_2$, a phase change material layer was formed at a temperature less than 300° C., that is, at 280° C. and at 240° C. using the Ge(II) source of Formula 18. However, the deposition rate of the phase change material layer at 280° C. and 240° C. was relatively low. The same result was obtained when using the Ge(II) source of Formula 19.

Figure 7A:
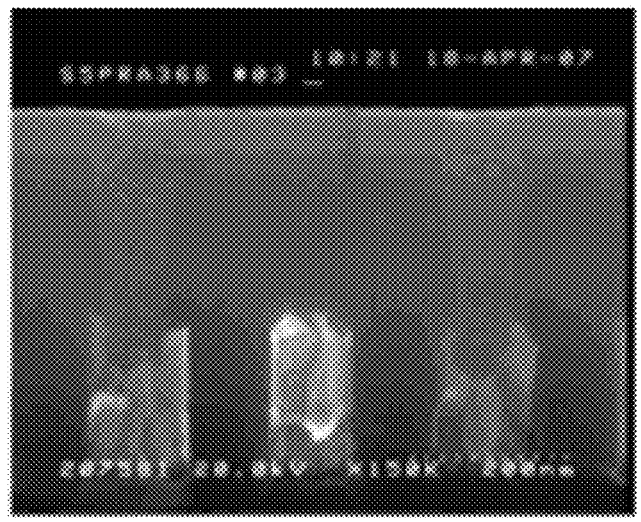
FIGS. 7A and 7B are photo images illustrating a phase change material layer formed according to an Experimental Example 2.
Figure 7B:
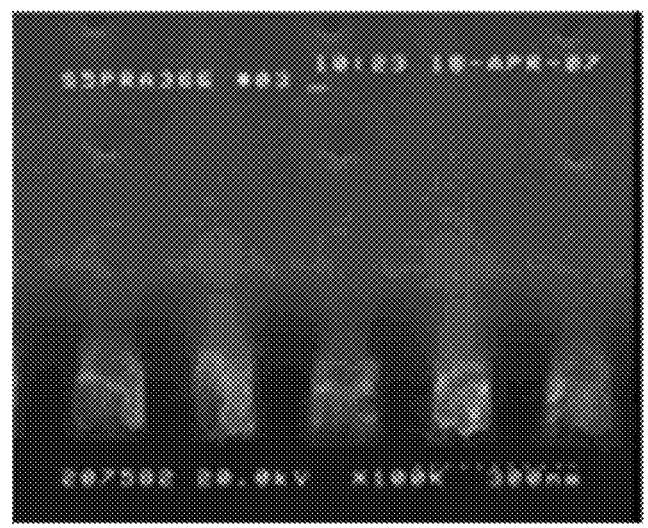
Figure 8A:
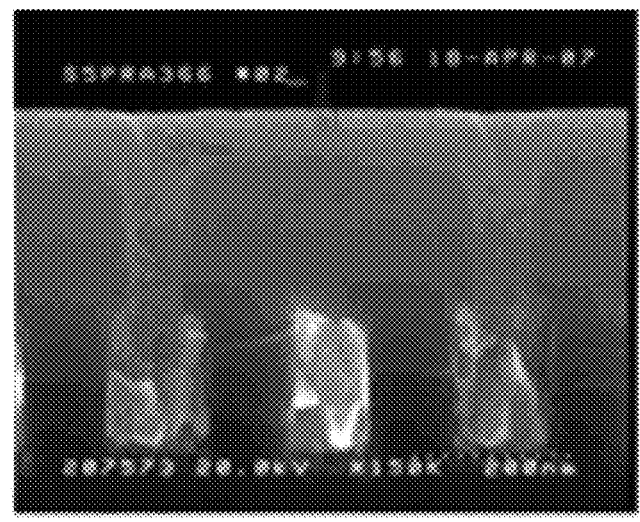
FIGS. 8A and 8B are photos illustrating a phase change material layer formed according to an Experimental Example 3.
Figure 8B:
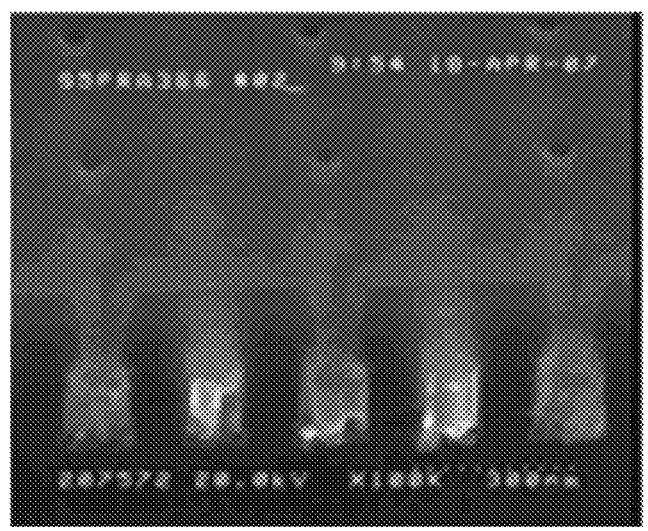
Figure 9A:
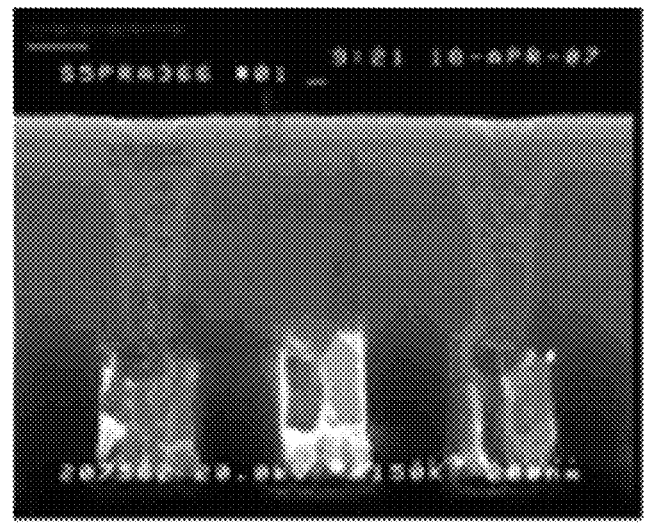
FIGS. 9A and 9B are photos illustrating a phase change material layer formed according to an Experimental Example 4.
Figure 9B:
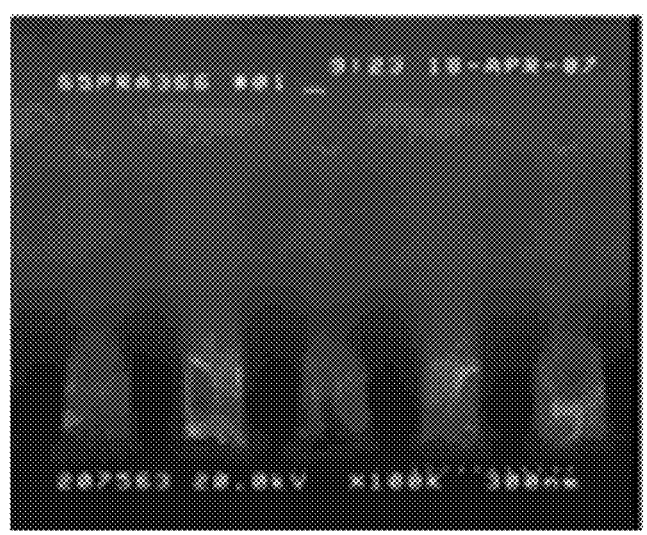

FIGS. 7A and 7B are photographic images of a phase change material layer formed according to Experimental Example 2 (NH$_3$ reaction gas and 280° C. deposition). FIGS. 8A and 8B are photographic images of a phase change material layer formed according to Experimental Example 3 (NH$_3$ reaction gas and 240° C. deposition). FIGS. 9A and 9B are photographic images of a phase change material layer formed according to Experimental Example 4 (NH$_3$ reaction gas and 200° C. deposition). Each of the photographic images provides visual confirmation that the phase change material layer conformally covered the side wall of a contact hole without blocking the entrance to the hole and without creating voids within the hole.

Figure 10:
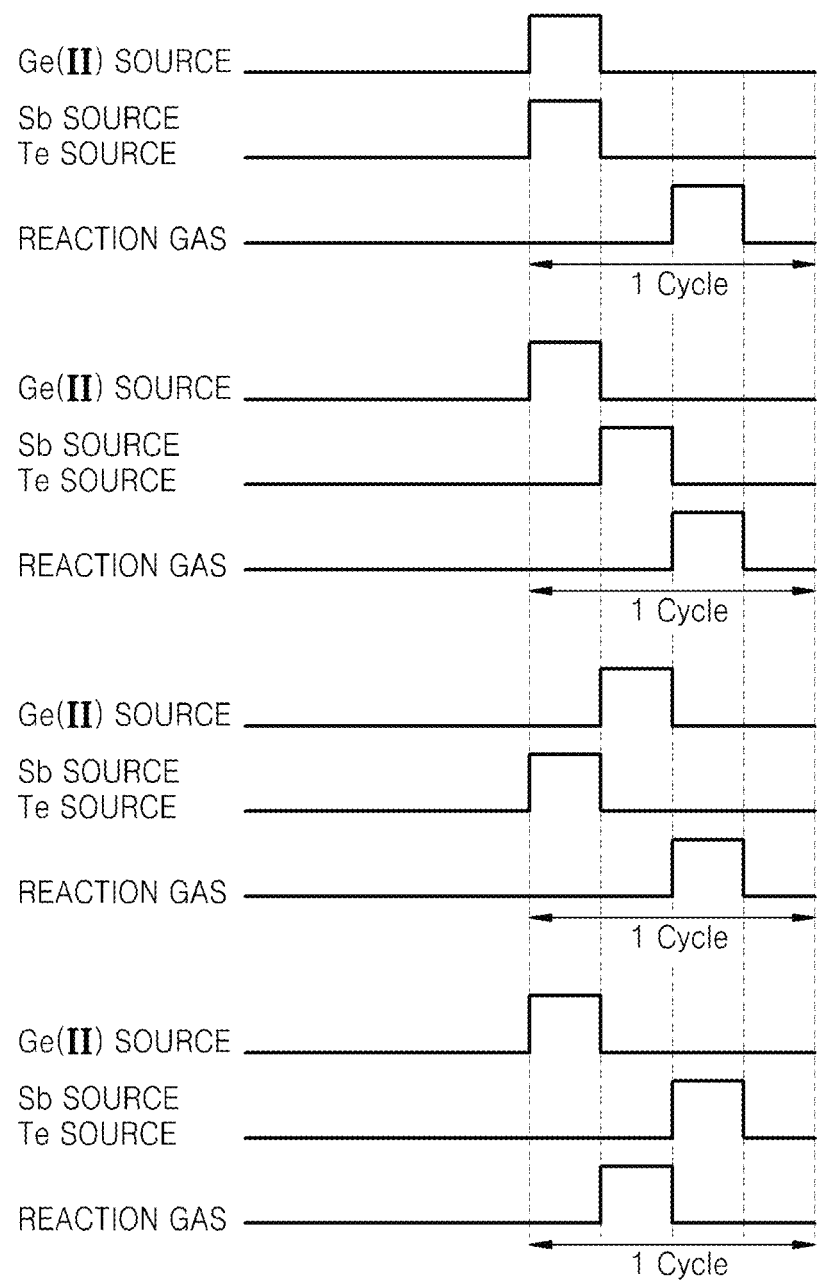
FIG. 10 is a pulsing diagram for describing the formation of a Ge—Sb—Te layer according to certain exemplary embodiments.

FIG. 10 is a pulsing diagram for describing the formation of a Ge—Sb—Te layer according to certain exemplary embodiments. As shown in FIG. 10, to form a phase change material layer, different substances can be provided to a reaction chamber at different times within repeated cycles. For example, a reaction gas, a first source, and a second source may be supplied to the reaction chamber. In certain embodiments, the first source is a Ge source, and the second source is a Sb or Te source. In other embodiments, the first source is a Sb or Te source, and the second source is a Ge source.

For example, in one embodiment, a reaction gas including the composition of Formula 1 (discussed above) may be supplied into a reaction chamber. At least a first source may also be supplied into the reaction chamber. The reaction gas may be supplied into the reaction chamber after supplying of the first source into the reaction chamber is stopped. In addition, a second source may be supplied to the reaction chamber, wherein the reaction gas is not supplied to the reaction chamber during supplying the second source into the reaction chamber. Furthermore, the supplying of the first source and the supplying of the second source may be partially or wholly overlapped. In certain embodiments, supplying of the second source occurs after supplying of the first source is stopped and before supplying of the reaction gas starts. For example, in one embodiment, during one cycle, a start of supplying the second source may occur after, or at the same time as, supplying of the first source is stopped, and an end of supplying the second source may occur before, or at the same time as, supplying of the reaction gas starts. In another embodiment, the supplying of the reaction gas may occur after supplying of the first source is stopped and before supplying the second source starts. For example, in one embodiment, during one cycle, a start of supplying the reaction gas may occur after, or at the same time as, supplying of the first source is stopped, and an end of supplying the reaction gas may occur before, or at the same time as, supplying of the second source starts. These different examples are shown in FIG. 10, examples (1)-(4).

In other embodiments, a plasma of a reaction gas may be provided to a reaction chamber, and a first source and/or a second source may also be provided to the reaction chamber. One or both of the first source and the second source may be provided to the reaction chamber as a plasma. The plasma of the reaction gas may be provided to the reaction chamber, for example, by forming the plasma of the reaction gas outside the reaction chamber, and supplying the plasma of the reaction gas into the reaction chamber. Alternatively, the plasma of the reaction gas may be provided to the reaction chamber, for example, by supplying the reaction gas into the reaction chamber, and forming the plasma of the reaction gas in the reaction chamber. The first or second sources may be provided to the reaction chamber while providing the plasma of the reaction gas to the reaction chamber.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a phase change material layer, the method comprising:
 supplying a reaction gas including the composition of Formula 1 into a reaction chamber; and
 supplying at least a first source which includes Ge(II) into the reaction chamber;
 wherein a start of supplying the reaction gas into the reaction chamber occurs after supplying of the first source into the reaction chamber is stopped;

$$NR_1R_2R_3 \quad \text{Formula 1}$$

wherein $R_1$, $R_2$ and $R_3$ are each independently at least one selected from the group consisting of H, $CH_3$, $C_2H_5$, $C_3H_7$, $C_4H_9$, $Si(CH_3)_3$, $NH_2$, $NH(CH_3)$, $N(CH_3)_2$, $NH(C_2H_5)$ and $N(C_2H_5)_2$.

2. The method according to claim 1, further comprising: supplying a second source wherein the reaction gas is not supplied to the reaction chamber during supplying the second source into the reaction chamber.

3. The method according to claim 2, wherein supplying of the first source and supplying of the second source are at least partially overlapped.

4. The method according to claim 2, wherein supplying of the second source occurs after supplying of the first source is stopped and before supplying of the reaction gas starts.

5. The method according to claim 2, wherein supplying the reaction gas occurs after supplying of the first source is stopped and before supplying the second source starts.

6. The method according to claim 1, wherein the first source comprises at least one selected from the group consisting of amide ligand, a phosphanido ligand, an alkoxide ligand and a thiolate ligand.

7. The method according to claim 6, wherein the first source includes the composition of at least one of Formulae 2 to 4:

$$R_1R_2X_1\text{—Ge—}X_2R_3R_4 \quad \text{Formula 2}$$

wherein $X_1$ and $X_2$ are each independently at least one of N and P, and
 wherein $R_1$, $R_2$, $R_3$ and $R_4$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (d) a $C_2$-$C_{12}$ olefinic group, (f) a $C_3$-$C_{12}$ olefinic group, where $CH_3$ is substituted with an imine group, an amine group, an alkoxy group or a ketone group, (g) a $C_3$-$C_{12}$ olefinic group, where $CH_3$ is substituted with an imine group, an amine group, an alkoxy group or a ketone group, where N of the imine group, N of the amine group, O of the alkoxy group or O of the ketone group is coordinated with Ge, (h) a $C_2$-$C_{13}$ acetylenic group, (i) an allenic group ($CHCCH_2$), (j) a cyano group (CN), (k) a NCX group, where X is O, S, Se or Te, (l) an azide ligand ($N_3$), (m) an amide ligand ($NR_5R_6$, where $R_5$ and $R_6$ are each independently a hydrogen atom, a $C_1$-$C_{10}$ alkyl group, a $C_2$-$C_{12}$ olefinic group, a $C_2$-$C_{13}$ acetylenic group or an allenic group), (n) $SiR_7R_8R_9$, where $R_7$, $R_8$ and $R_9$ are each independently a hydrogen atom, a $C_1$-$C_{10}$ alkyl group, a $C_2$-$C_{12}$ olefinic group, a $C_2$-$C_{13}$ acetylenic group or an allenic group, and wherein the representation of Formula 2 includes non-ring systems and ring systems in which at least two of the $R_1$, $R_2$, $R_3$ and $R_4$ are chemically linked;

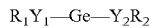  Formula 3 wherein $Y_1$ and $Y_2$ are each independently at least one of O and S, wherein $R_1$ and $R_2$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (e) a $C_2$-$C_{12}$ olefinic group, (f) a $C_3$-$C_{12}$ olefinic group, where $CH_3$ is substituted with an imine group, an amine group, an alkoxy group or a ketone group, (g) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (h) a $C_2$-$C_{13}$ acetylenic group, (i) an allenic group ($CHCCH_2$), (j) a cyano group (CN), (k) a NCX group, where X is O, S, Se or Te, (l) an azide ligand ($N_3$), (m) an amide ligand ($NR_3R_4$, where $R_3$ and $R_4$ are each independently a hydrogen atom, a $C_1$-$C_{10}$ alkyl group, a $C_2$-$C_{12}$ olefinic group, a $C_2$-$C_{13}$ acetylenic group or an allenic group), (n) $SiR_5R_6R_7$, where $R_5$, $R_6$ and $R_7$ are each independently at least one of a hydrogen atom, a $C_1$-$C_{10}$ alkyl group, a $C_2$-$C_{12}$ olefinic group, a $C_2$-$C_{13}$ acetylenic group or an allenic group, and wherein the representation of Formula 3 includes non-ring systems and ring systems in which $R_1$ and $R_2$ are chemically linked;

  Formula 4 wherein X is at least one of N and P, and Y is at least one of O and S, wherein $R_1$, $R_2$ and $R_3$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (d) a $C_2$-$C_{12}$ olefinic group, (f) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (g) a $C_2$-$C_{13}$ acetylenic group, (h) an allenic group ($CHCCH_2$), (i) a cyano group (CN), (j) a NCX group, where X is O, S, Se or Te, (k) an azide ligand ($N_3$), (l) an amide ligand ($NR_4R_5$, where $R_4$ and $R_5$ are each independently a hydrogen atom, a $C_1$-$C_{10}$ alkyl group, a $C_2$-$C_{12}$ olefinic group, a $C_2$-$C_{13}$ acetylenic group or an allenic group), (m) $SiR_6R_7R_8$, where $R_6$, $R_7$ and $R_8$ are each independently a hydrogen atom, a $C_1$-$C_{10}$ alkyl group, a $C_2$-$C_{12}$ olefinic group, a $C_2$-$C_{13}$ acetylenic group or an allenic group, and wherein the representation of Formula 4 includes non-ring systems and ring systems in which at least two of $R_1$, $R_2$ and $R_3$ are chemically linked.

8. The method according to claim 6, wherein the first source includes the composition of at least one of Formulae 5 to 17:

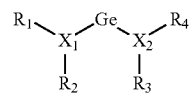  Formula 5 wherein $X_1$ and $X_2$ are each independently one of N and P, and wherein $R_1$, $R_2$, $R_3$ and $R_4$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

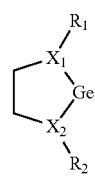  Formula 6 wherein $X_1$ and $X_2$ are each independently one of N and P, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

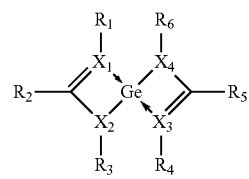  Formula 7 wherein $X_1$, $X_2$, $X_3$ and $X_4$ are each independently one of N and P, and wherein $R_1$, $R_2$, $R_3$, $R_4$, $R_5$ and $R_6$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

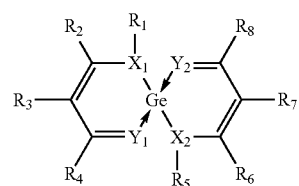  Formula 8 wherein $X_1$ and $X_2$ are each independently one of N and P, wherein $Y_1$ and $Y_2$ are each independently one of O and S, and wherein $R_1$, $R_2$, $R_3$, $R_4$, $R_5$, $R_6$, $R_7$ and $R_8$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

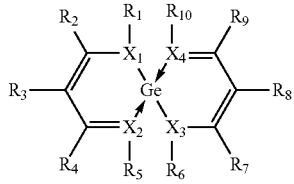

Formula 9 wherein $X_1$, $X_2$, $X_3$ and $X_4$ are each independently one of N and P, and wherein $R_1$, $R_2$, $R_3$, $R_4$, $R_5$, $R_6$, $R_7$, $R_8$, $R_9$ and $R_{10}$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

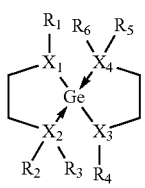

Formula 10 wherein $X_1$, $X_2$, $X_3$ and $X_4$ are each independently one of N and P, and wherein $R_1$, $R_2$, $R_3$, $R_4$, $R_5$ and $R_6$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

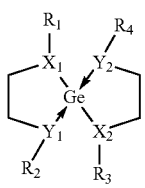

Formula 11 wherein $X_1$ and $X_2$ are each independently one of N and P, wherein $Y_1$ and $Y_2$ are each independently one of O and S, and wherein $R_1$, $R_2$, $R_3$ and $R_4$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

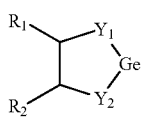

Formula 12 wherein $Y_1$ and $Y_2$ are each independently one of O and S, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

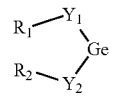

Formula 13 wherein $Y_1$ and $Y_2$ are each independently one of O and S, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

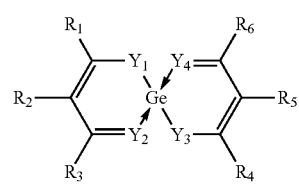

Formula 14 wherein $Y_1$, $Y_2$, $Y_3$ and $Y_4$ are each independently one of O and S, and wherein $R_1$, $R_2$, $R_3$, $R_4$, $R_5$ and $R_6$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

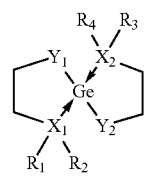

Formula 15 wherein $X_1$ and $X_2$ are each independently one of N and P, wherein $Y_1$ and $Y_2$ are each independently one of O and S, and wherein $R_1$, $R_2$, $R_3$ and $R_4$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group;

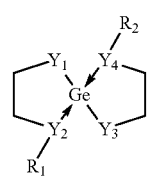

Formula 16 wherein $Y_1$, $Y_2$, $Y_3$ and $Y_4$ are each independently one of O and S, and wherein $R_1$ and $R_2$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group; and

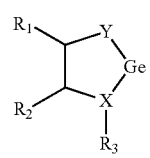

Formula 17 wherein X is one of N and P, wherein Y is one of O and S, and wherein $R_1$, $R_2$ and $R_3$ are each independently one selected from the group consisting of a hydrogen atom, a $C_1$-$C_{10}$ alkyl group, a $C_2$-$C_{12}$ olefinic group, a $C_2$-$C_{13}$ acetylenic group and an allenic group.

9. A method of fabricating a phase change material layer, the method comprising:
providing a plasma of a reaction gas including the composition of Formula 1 to a reaction chamber; and
providing at least a first source which includes Ge(II) to the reaction chamber;
wherein the first source is provided to the reaction chamber while providing a plasma of the reaction gas to the reaction chamber;

$$NR1R2R3 \quad \text{Formula 1}$$

wherein R1, R2 and R3 are each independently at least one selected from the group consisting of H, CH3, C2H5, C3H7, C4H9, Si(CH3)3, NH2, NH(CH3), N(CH3)2, NH(C2H5) and N(C2H5)2.

10. The method according to claim 9, wherein the first source is provided to the reaction chamber as a plasma.

11. The method according to claim 9, further comprising: providing a second source to the reaction chamber.

12. The method according to claim 11, wherein the second source is provided to the reaction chamber as a plasma.

13. The method according to claim 9, wherein providing the plasma of the reaction gas to the reaction chamber comprises:
forming the plasma of the reaction gas outside the reaction chamber; and
supplying the plasma of the reaction gas into the reaction chamber.

14. The method according to claim 9, wherein providing the plasma of the reaction gas comprises:
supplying the reaction gas into the reaction chamber; and
forming the plasma of the reaction gas in the reaction chamber.

15. The method according to claim 9, wherein the first source includes the composition of at least one of Formulae 2 to 4:

$$R_1R_2X_1\text{—Ge—}X_2R_3R_4 \quad \text{Formula 2}$$

wherein $X_1$ and $X_2$ are each independently at least one of N and P, and
wherein $R_1$, $R_2$, $R_3$ and $R_4$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (e) a $C_2$-$C_{12}$ olefinic group, (f) a $C_3$-$C_{12}$ olefinic group, where $CH_3$ is substituted with an imine group, an amine group, an alkoxy group or a ketone group, (g) a $C_3$-$C_{12}$ olefinic group, where $CH_3$ is substituted with an imine group, an amine group, an alkoxy group or a ketone group, where N of the imine group, N of the amine group, O of the alkoxy group or O of the ketone group is coordinated with Ge, (h) a $C_2$-$C_{13}$ acetylenic group, (i) an allenic group ($CHCCH_2$), (j) a cyano group (CN), (k) a NCX group, where X is O, S, Se or Te, (l) an azide ligand ($N_3$), (m) an amide ligand ($NR_5R_6$, where $R_5$ and $R_6$ are each independently a hydrogen atom, a $C_1$-$C_{10}$ alkyl group, a $C_2$-$C_{12}$ olefinic group, a $C_2$-$C_{13}$ acetylenic group or an allenic group), (n) $SiR_7R_8R_9$, where $R_7$, $R_8$ and $R_9$ are each independently a hydrogen atom, a $C_1$-$C_{10}$ alkyl group, a $C_2$-$C_{12}$ olefinic group, a $C_2$-$C_{13}$ acetylenic group or an allenic group, and
wherein the representation of Formula 2 includes non-ring systems and ring systems in which at least two of the $R_1$, $R_2$, $R_3$ and $R_4$ are chemically linked;

$$R_1Y_1\text{—Ge—}Y_2R_2 \quad \text{Formula 3}$$

wherein $Y_1$ and $Y_2$ are each independently at least one of O and S,
wherein $R_1$ and $R_2$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (e) a $C_2$-$C_{12}$ olefinic group, (f) a $C_3$-$C_{12}$ olefinic group, where $CH_3$ is substituted with an imine group, an amine group, an alkoxy group or a ketone group, (g) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (h) a $C_2$-$C_{13}$ acetylenic group, (i) an allenic group ($CHCCH_2$), (j) a cyano group (CN), (k) a NCX group, where X is O, S, Se or Te, (l) an azide ligand ($N_3$), (m) an amide ligand ($NR_3R_4$, where $R_3$ and $R_4$ are each independently a hydrogen atom, a $C_1$-$C_{10}$ alkyl group, a $C_2$-$C_{12}$ olefinic group, a $C_2$-$C_{13}$ acetylenic group or an allenic group), (n) $SiR_5R_6R_7$, where $R_5$, $R_6$ and $R_7$ are each independently at least one of a hydrogen atom, a $C_1$-$C_{10}$ alkyl group, a $C_2$-$C_{12}$ olefinic group, a $C_2$-$C_{13}$ acetylenic group or an allenic group, and
wherein the representation of Formula 3 includes non-ring systems and ring systems in which $R_1$ and $R_2$ are chemically linked;

$$R_1R_2X\text{—Ge—}YR_3 \quad \text{Formula 4}$$

wherein X is at least one of N and P, and Y is at least one of O and S,
wherein $R_1$, $R_2$ and $R_3$ are each independently at least one selected from the group consisting of (a) a hydrogen atom, (b) a $C_1$-$C_{10}$ alkyl group, (c) a $C_1$-$C_{10}$ alkyl group, where $CH_3$ is substituted with an imine group, an amine group, an alkoxy group or a ketone group, (d) a $C_1$-$C_{10}$ alkyl group, where $CH_3$ is substituted with an imine group, an amine group, an alkoxy group or a ketone group, and where N of the imine group, N of the amine group, O of the alkoxy group or O of the ketone group is coordinated with Ge, (d) a $C_2$-$C_{12}$ olefinic group, (f) a $C_3$-$C_{12}$ olefinic group, where $CH_3$ is substituted with an imine group, an amine group, an alkoxy group or a ketone group, and where N of the imine group, N of the amine group, O of the alkoxy group or O of the ketone group is coordinated with Ge, (g) a $C_2$-$C_{13}$ acetylenic group, (h) an allenic group ($CHCCH_2$), (i) a cyano group (CN), (j) a NCX group, where X is O, S, Se or Te, (k) an azide ligand ($N_3$), (l) an amide ligand ($NR_4R_5$, where $R_4$ and $R_5$ are each independently a hydrogen atom, a $C_1$-$C_{10}$ alkyl group, a $C_2$-$C_{12}$ olefinic group, a $C_2$-$C_{13}$ acetylenic group or an allenic group), (m) $SiR_6R_7R_8$, where $R_6$, $R_7$ and $R_8$ are each independently a hydrogen atom, a $C_1$-$C_{10}$ alkyl group, a $C_2$-$C_{12}$ olefinic group, a $C_2$-$C_{13}$ acetylenic group or an allenic group, and wherein the representation of Formula 4 includes non-ring systems and ring systems in which at least two of $R_1$, $R_2$ and $R_3$ are chemically linked.

* * * * *